United States Patent
Nii

(10) Patent No.: US 9,502,112 B2
(45) Date of Patent: Nov. 22, 2016

(54) SEMICONDUCTOR MEMORY DEVICE

(71) Applicant: Renesas Electronics Corporation, Koutou-ku, Tokyo (JP)

(72) Inventor: Koji Nii, Tokyo (JP)

(73) Assignee: Renesas Electronics Corporation, Tokyo (JP)

( * ) Notice: Subject to any disclaimer, the term of this patent is extended or adjusted under 35 U.S.C. 154(b) by 0 days.

(21) Appl. No.: 15/004,990

(22) Filed: Jan. 24, 2016

(65) Prior Publication Data

US 2016/0247569 A1    Aug. 25, 2016

(30) Foreign Application Priority Data

Feb. 25, 2015    (JP) .................. 2015-035377

(51) Int. Cl.
*G11C 15/00* (2006.01)
*G11C 15/04* (2006.01)

(52) U.S. Cl.
CPC ..................... *G11C 15/04* (2013.01)

(58) Field of Classification Search
CPC ...................................... G11C 15/04
USPC ............... 365/49.1, 49.17, 49.16, 154
See application file for complete search history.

(56) References Cited

U.S. PATENT DOCUMENTS

| | | | |
|---|---|---|---|
| 6,154,384 A | 11/2000 | Nataraj et al. | |
| 6,646,900 B2 | 11/2003 | Tsuda et al. | |
| 6,731,526 B2 | 5/2004 | Inoue | |
| 6,751,701 B1 | 6/2004 | Pereira | |
| 2015/0179262 A1* | 6/2015 | Arsovski | G11C 15/04 365/49.11 |

FOREIGN PATENT DOCUMENTS

| | | |
|---|---|---|
| JP | 07-220483 A | 8/1995 |
| JP | 2002-373494 A | 12/2002 |
| JP | 2003-141879 A | 5/2003 |
| JP | 2003-272386 A | 9/2003 |
| JP | 2005-501369 A | 1/2005 |

* cited by examiner

*Primary Examiner* — Fernando Hidalgo
(74) *Attorney, Agent, or Firm* — Shapiro, Gabor and Rosenberger, PLLC

(57) ABSTRACT

A semiconductor memory device capable of a high-accuracy data search is provided. Each of the memory cells can hold two bits of information and includes a first cell and a second cell. The semiconductor memory device also includes a match line and a search line pair to transfer search data. The semiconductor memory device further includes a logic operation cell to drive the match line based on comparison results between information held in the first and the second cell and search data transferred by the search line pair and a search line driver to drive the search line pair. In a state with the search line pair precharged to a third voltage between a first voltage and a second voltage, the search line driver drives, according to the search data, one and the other search line included in the search line pair to the first and the second voltage, respectively.

11 Claims, 17 Drawing Sheets

FIG. 4

| | WL0 | WL1 | WL2 TO 7 | BL0 | BL1 | SL0 | /SL0 | SL1 | /SL1 | ML |
|---|---|---|---|---|---|---|---|---|---|---|
| WHEN WRITING DATA TO #0 | H | L | L | D0 | D1 | | | | | |
| WHEN WRITING MASK DATA TO #0 | L | H | L | MD0 | MD1 | | | | | |
| WHEN SEARCHING DATA AT #0 | L | L | L | H | H | SD0 | /SD0 | SD1 | /SD1 | OUT |

$\begin{pmatrix} \text{OUT: MATCH = H} \\ \text{NON-MATCH = L} \end{pmatrix}$

FIG. 10

| | WL0 | WL1 | WL2 TO 3 | BL0A | BL0B | BL1A | BL1B | SL0 | /SL0 | SL1 | /SL1 | ML |
|---|---|---|---|---|---|---|---|---|---|---|---|---|
| WHEN WRITING DATA TO #0 | H | L | L | D0#0 | D0#1 | D1#0 | D1#1 | L | L | L | L | H |
| WHEN WRITING MASK DATA TO #0 | L | H | L | MD0#0 | MD0#1 | MD1#0 | MD1#1 | L | L | L | L | H |
| WHEN SEARCHING DATA AT #0 | L | L | L | H | H | H | H | SD0 | /SD0 | SD1 | /SD1 | OUT |

$\begin{pmatrix} \text{OUT: MATCH = H} \\ \text{NON-MATCH = L} \end{pmatrix}$

SEMICONDUCTOR MEMORY DEVICE

CROSS-REFERENCE TO RELATED APPLICATIONS

The disclosure of Japanese Patent Application No. 2015-035377 filed on Feb. 25, 2015 including the specification, drawings and abstract is incorporated herein by reference in its entirety.

BACKGROUND

The present disclosure relates to a semiconductor memory device, particularly, to a ternary content addressable memory (TCAM).

In recent years with the Internet in wide use, demand has been increasing for content-addressable memories (CAMs) having an address search function, particularly, ternary content-addressable memories (TCAMs) including memory cells each capable of holding three values, 0, 1, and X. In many cases, TCAMs are used in the system-on-a-chip (SoC) field, particularly, in system LSIs such as routers and network switches (see Japanese Unexamined Patent Application Publications Nos. 2003-272386 and 2002-373494, U.S. Pat. No. 6,154,384, Japanese Unexamined Patent Application Publications Nos. 2003-141879 and Hei 7(1995)-220483, Japanese Unexamined Patent Application Publication (Translation of PCT Application) No. 2005-501369).

SUMMARY

In recent years, the memory capacities of TCAMs have been increasing and TCAMs are required to be manufactured in higher integration density.

A TCAM includes a search line for transferring search data and can determine a data search result by detecting a change in the potential of a match line whose potential changes according to whether a result of comparison between data held in a memory cell and search data is a match or a non-match.

In the above respect, there is possibility that the potential of the match line varies by being affected by coupling capacitance between the match line and the search line to transfer search data. This may make determining a data search result difficult. As a TCAM has a larger memory capacity, the number of memory cells coupled to a match line increases, so that the above variation in the potential of the match line becomes larger.

The present disclosure has been made in view of the above problem, and it is an object of the present disclosure to provide a semiconductor memory device capable of high-accuracy data search operation.

Other objects and novel features of the present disclosure will become apparent from the description of this specification and attached drawings.

According to an embodiment of the present disclosure, a semiconductor memory device includes plural memory cells arranged like a matrix. Each of the memory cells is configured to be capable of holding two bits of information and includes a first cell configured to be capable of holding one bit of information and a second cell adjacent, in a column direction, to the first cell and configured to be capable of holding another bit of information. The semiconductor memory device also includes: a bit line pair extending in the column direction and coupled to both the first and the second cell; a first and a second word line extending in a row direction and coupled to each of the first and the second cell; a match line extending in the row direction; and a search line pair extending in the column direction to transfer search data for a data search. The semiconductor memory device further includes: a logic operation cell coupled to the search line pair and the match line to drive the match line based on comparison results between information held in the first and the second cell and search data transferred by the search line pair; and a search line driver provided correspondingly to the search line pair to drive the search line pair. In the semiconductor memory device, in a state with the search line pair precharged to a third voltage between a first voltage and a second voltage, the search line driver drives, according to the search data, one and the other search line included in the search line pair to the first and the second voltage, respectively.

According to an embodiment of the present disclosure, in a state with a search line pair precharged to a third voltage between a first voltage and a second voltage, a search line driver drives, according to search data, one and the other search line included in the search line pair to the first and the second voltage, respectively. This inhibits variation in the potential of a match line to enable high-accuracy data search operation.

BRIEF DESCRIPTION OF THE DRAWINGS

FIG. 4 is a diagram for explaining memory cell operation according to the first embodiment.

FIG. 10 is a diagram for explaining memory cell operation according to the second embodiment.

DETAILED DESCRIPTION

Figure 1:
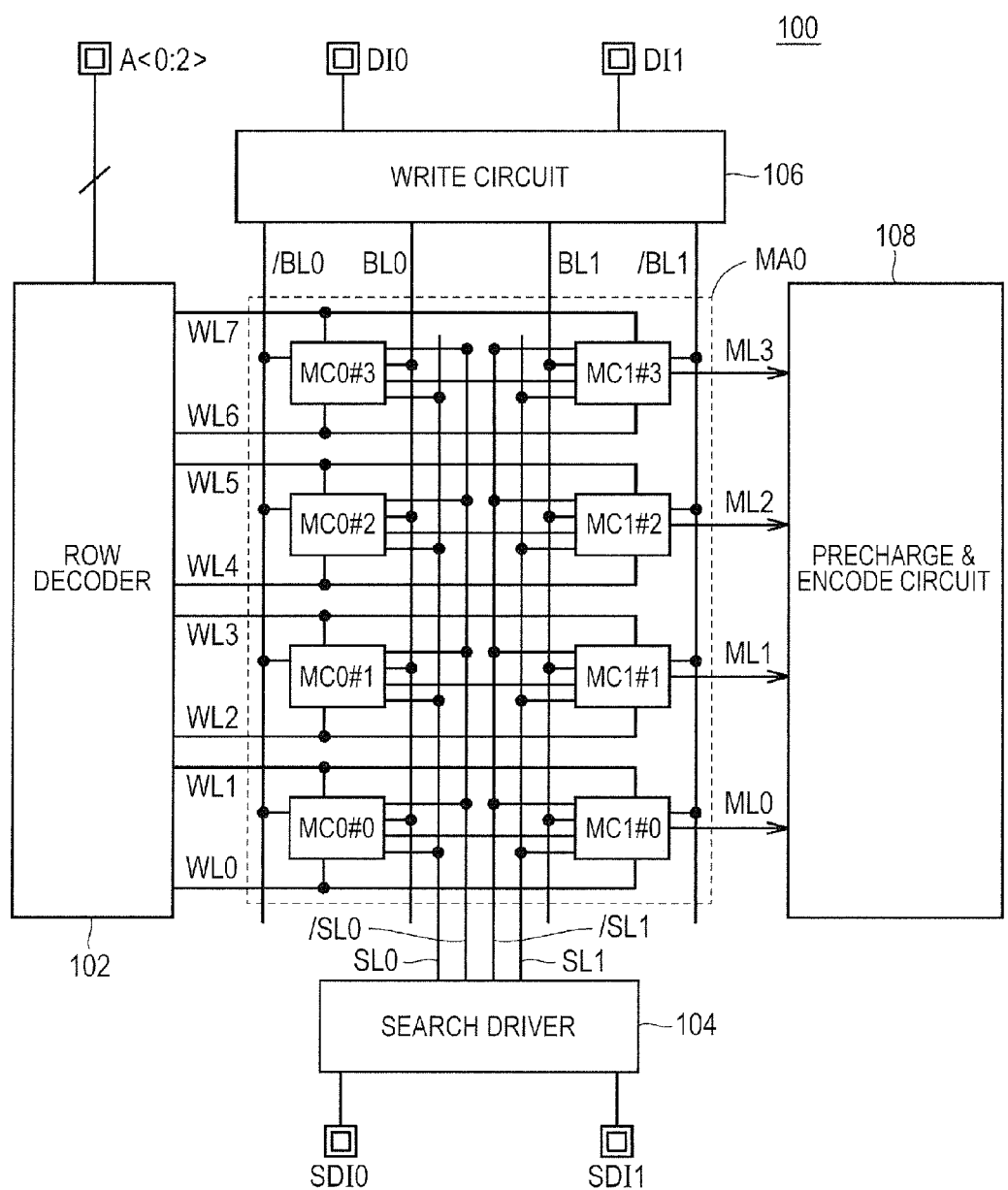
FIG. 1 is a block diagram showing an approximate configuration of a semiconductor memory device 100 according to a first embodiment of the present disclosure.

Embodiments of the present invention will be described in detail with reference to drawings. In the drawings referred to in the following descriptions, like parts are denoted by like reference numerals and symbols, and such like parts will not be described repeatedly.

First Embodiment

FIG. 1 is a block diagram showing an approximate configuration of a semiconductor memory device 100 according to a first embodiment of the present disclosure.

Referring to FIG. 1, the semiconductor memory device 100 includes a row decoder 102, a write circuit 106, a search driver 104, a precharge & encode circuit 108, and a memory array MA0.

The row decoder 102 receives an address signal A<0:2> and activates word lines WL0 to WL7.

The write circuit 106 drives a bit line pair BL0-/BL0 according to input data DI0 and drives a bit line pair BL1-/BL1 according to input data DI1.

The search driver 104 drives a search line pair SL0-/SL0 according to a search data signal SDI0 and drives a search line pair SL1-/SL1 according to a search data signal SDI1.

The memory array MA0 includes plural memory cells arranged like a matrix.

The memory array MA0 also includes word lines WL0 to WL7, bit line pairs BL0-/BL0 and BL1-/BL1, search line pairs SL0-/SL0 and SL1-/SL1, and match lines ML0 to ML3.

The precharge & encode circuit 108 precharges match lines ML0 to ML3 and encodes the search results outputted to the match lines ML0 to ML3.

In the memory array MA0 shown in FIG. 1 as an example to simply description, memory cells are arranged in two columns by 4 rows. Namely, the memory array MA0 has memory cells MC0#0 to MC0#3 arranged in a first column and memory cells MC1#0 to MC1#3 arranged in a second column. The "#0" to "#3" referred to above represent address numbers called entries. For example, "#0" represents address number 0 and, when specified for a data read or data write operation, allows two TCAM cells MC0#0 and MC1#0 to be accessed at a time.

Each memory cell stores two bits of data, i.e. one bit each of storage data and mask data. The storage data is an object of comparison with search data. The mask data makes setting for each bit as to whether to subject the bit to comparison with search data.

Word lines WL0, WL2, WL4, and WL6 are activated when storage data is read from or written to the memory cells. Word lines WL1, WL3, WL5, and WL7 are activated when mask data is read from or written to the memory cells.

The memory cells MC0#0 to MC0#3 in the first column are each coupled with the bit line pair BL0-/BL0 and with the search line pair SL0-/SL0. The memory cells MC1#0 to MC1#3 in the second column are each coupled with the bit line pair BL1-/BL1 and with the search line pair SL1-/SL1.

The memory cells MC0#0 and MC1#0 in the first row, i.e. the memory cells of address #0 are each coupled with word lines WL0 and WL1 and with match line ML0. Similarly, the memory cells MC0#1 and MC1#1 in the second row are each coupled with word lines WL2 and WL3 and with match line ML1. The memory cells MC0#2 and MC1#2 in the third row are each coupled with word lines WL4 and WL5 and with match line ML2. The memory cells MC0#3 and MC1#3 in the fourth row are each coupled with word lines WL6 and WL7 and with match line ML3.

Even though, in the example shown in FIG. 1, search data SDI0 and SDI0, input data DI0 and DI1, and address signal A<0:2> are inputted via terminals, such data and signal may be received from other blocks, for example, in a case where the CAM like this is incorporated in a system LSI. Even though no configuration is shown regarding data reading, it is possible to provide sense amplifiers in parallel with the write circuit and read storage data and mask data written in memory cells via the sense amplifiers.

Even though, in the present example, the memory cells are arranged in a two-column configuration to make description simple, the two-column configuration may be repeatedly arranged so as to increase the number of bits per address.

Figure 2:
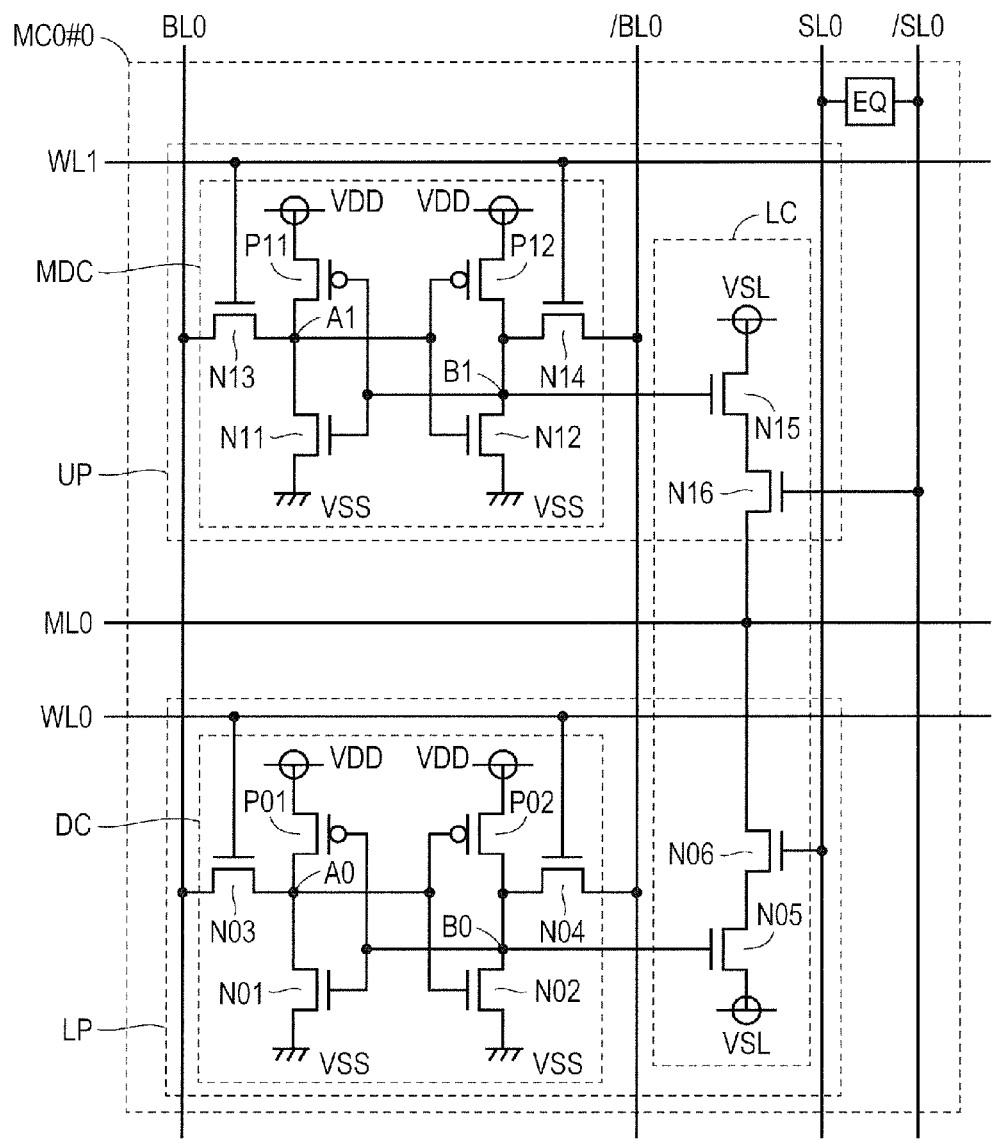
FIG. 2 is a circuit diagram showing the configuration of a memory cell MC0#0 according to the first embodiment.

FIG. 2 is a circuit diagram showing the configuration of the memory cell MC0#0 according to the first embodiment.

As shown in FIG. 2, the memory cell MC0#0 includes a data cell DC configured to be capable of storing one bit of storage data and a mask data cell MDC configured to be capable of storing one bit of mask bit information. The two cells are adjacent to each other in the column direction, i.e. along the bit lines.

The memory cell MC0#0 further includes the portions corresponding thereto of the bit line pair BL0-/BL0 extending in the column direction and coupled to both the data cell DC and the mask data cell MDC, the word line WL0 extending in the row direction and coupled to the data cell DC, the word line WL1 extending in the row direction and coupled to the mask data cell MDC, and the search line pair SL0-/SL0 that extends in parallel with the bit line pair BL0-/BL0 and transfers search data.

The memory cell MC0#0 still further includes the portion corresponding thereto of the match line ML0 extending in parallel with the word lines and a logic operation cell LC formed to be adjacent, in the row direction, to both the data cell DC and the mask data cell MDC. The logic operation cell LC outputs an operation result obtained based on the information stored in the data cell DC and mask data cell MDC and search data to the match line ML0.

As being described in detail later referring to a layout drawing, the gates of the transistors included in each memory cell extend along the row direction, and the region where each memory cell is formed includes plural wells. The plural wells are formed to be continuous with the corresponding wells formed in the adjacent memory cells in the column direction. Thus, in the memory array, the wells extend to be elongated in the column direction.

The data cell DC includes N-channel MOS transistors N01 to N04 and P-channel MOS transistors P01 and P02.

The N-channel MOS transistor N03 is coupled between memory node A0 and bit line BL0 with the gate thereof coupled with word line WL0. The N-channel MOS transistor N04 is coupled between memory node B0 and bit line /BL0 with the gate thereof coupled with word line WL0. The P-channel MOS transistor P01 is coupled between power supply line VDD and memory node A0 with the gate thereof coupled to memory node B0. The N-channel MOS transistor N01 is coupled between memory node A0 and the ground line VSS with the gate thereof coupled to memory node B0. The P-channel MOS transistor P02 is coupled between the power supply line VDD and memory node B0 with the gate thereof coupled to memory node A0. The N-channel MOS transistor N02 is coupled between memory node B0 and the ground line VSS with the gate thereof coupled to memory node A0.

The mask data cell MDC includes N-channel MOS transistor N11 to N14 and P-channel MOS transistors P11 and P12. The N-channel MOS transistor N13 is coupled between memory node A1 and bit line BL0 with the gate thereof coupled with word line WL1. The N-channel MOS transistor N14 is coupled between memory node B1 and bit line /BL0 with the gate thereof coupled with word line WL1. The P-channel MOS transistor P11 is coupled between the power supply line VDD and memory node A1 with the gate thereof coupled to memory node B1. The N-channel MOS transistor N11 is coupled between memory node A1 and the ground line VSS with the gate thereof coupled to memory node B1. The P-channel MOS transistor P12 is coupled between the power supply line VDD and memory node B1 with the gate thereof coupled to memory node A1. The N-channel MOS transistor N12 is coupled between memory node B1 and the ground line VSS with the gate thereof coupled to memory node A1.

The logic operation cell LC includes N-channel MOS transistors N05, N06, N15, and N16.

The N-channel MOS transistors N05 and N06 are coupled in series between match line ML0 and power supply line VSL with the gates thereof coupled with memory node B0 and search line SL0, respectively.

The N-channel MOS transistors N15 and N16 are coupled in series between match line ML0 and power supply line VSL with the gates thereof coupled with memory node B1 and search line /SL0, respectively.

Referring to FIG. 2, an equalizer circuit (EQ) is provided between the search lines SL0 and /SL0. As being described later, the equalizer circuit (EQ) is activated at predetermined timing to electrically couple the two search lines.

The other memory cells also shown in FIG. 1 differ from the memory cell MC0#0 as to where they are coupled to the corresponding word lines, match lines, and bit lines, but they each have an internal circuit configuration similar to that of the memory cell MC0#0, so that their internal circuit configurations will not be described herein.

Figure 3:
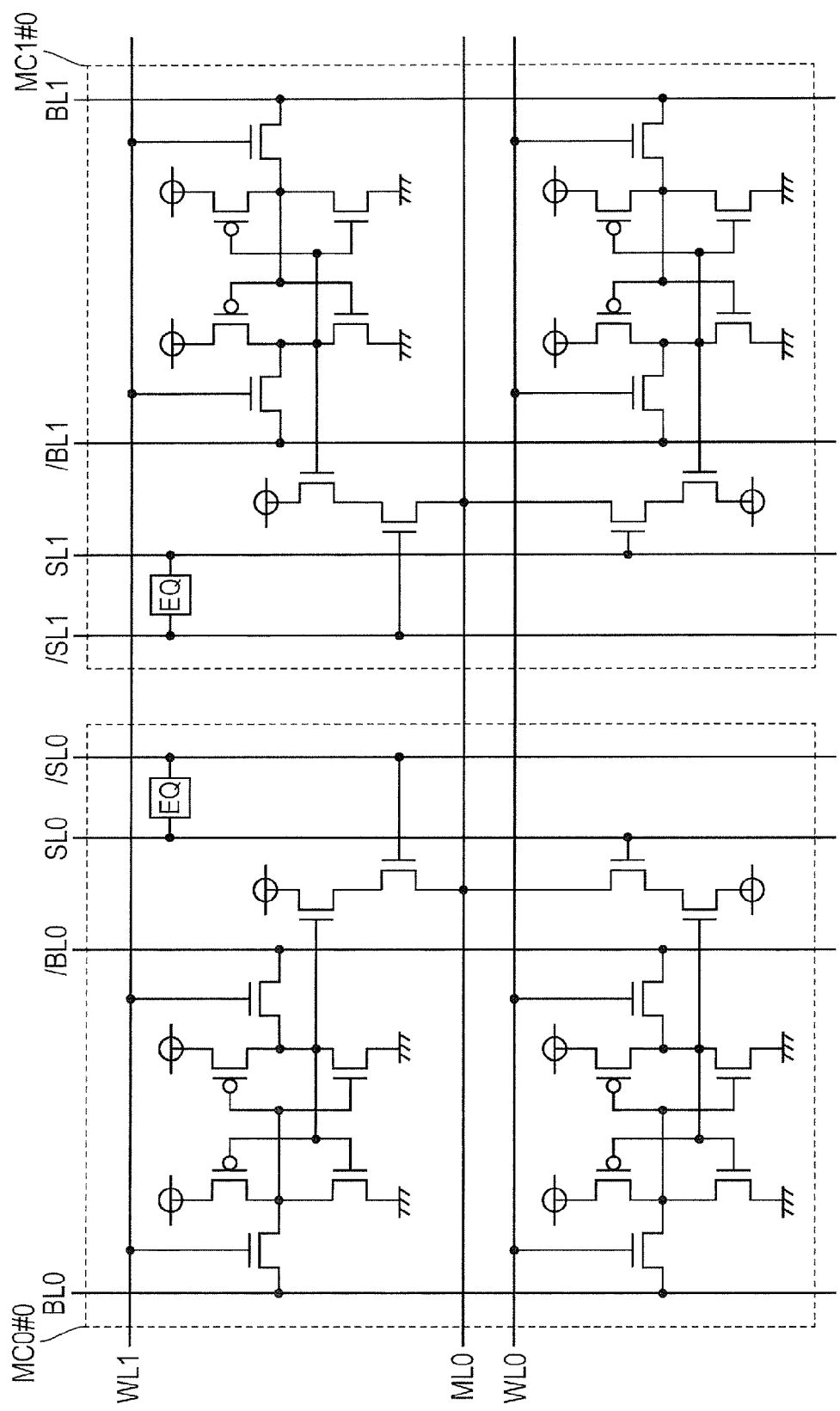
FIG. 3 is a diagram illustrating the layout of a portion of the memory array shown in FIG. 1.

FIG. 3 is a diagram illustrating the layout of a portion of the memory array MA0 shown in FIG. 1.

As shown in FIG. 3, the memory cells MC0#0 and MC1#0 are arranged adjacently to each other in the row direction. Search lines are provided for each column of TCAM cells included in the memory array. Namely, the search line pair SL0-/SL0 extends through the memory cell MC0#0, and the search line pair SL1-/SL1 extends through the memory cell MC1#0. A match line is provided for each row of cells. Namely, for the first memory cell row (including the memory cells MC0#0 and MC1#0) shown in FIG. 3, the match line ML0 is provided.

FIG. 4 is a diagram for explaining memory cell operation according to the first embodiment.

Referring to FIGS. 3 and 4, operation associated with address #0 will be briefly described.

When writing data to address #0, the word line WL0 is activated to "H" level and the word line WL1 is deactivated to "L" level. The word lines WL2 to WL7 corresponding to the other addresses than address #0 are deactivated to "L" level. The bit line BL0 is set to a level corresponding to data bit D0 holding data to be written. The bit line /BL0 is set to an inverted level with respect to the level of the bit line BL0. The bit line BL1 is set to a level corresponding to data bit D1. The bit line /BL1 is set to an inverted level with respect to the level of the bit line BL1.

The search line pairs SL0-/SL0 and SL1-/SL1 are all set to "L" level. The match line ML need not be set to a particular level, but it is preferably kept precharged to "H" level.

With the word lines and other lines controlled as described above, the data at data bit D0 is written to data cell DC of the memory cell MC0#0 and the data at data bit D1 is written to data cell DC of the memory cell MC1#1. When reading, the bit line potential difference is amplified by a sense amplifier (not shown) causing the data bits D0 and D1 to be read.

When mask data for address #0 is to be written, the word line WL1 is activated to "H" level and the word line WL0 is deactivated to "L" level. The word lines WL2 to WL7 corresponding to the other addresses than address #0 are deactivated to "L" level. The bit line BL0 is set to a level corresponding to the mask data bit MD0 to be written. The bit line /BL0 is set to an inverted level with respect to the level of the bit line BL0. The bit line BL1 is set to a level corresponding to the mask data bit MD1. The bit line /BL1 is set to an inverted level with respect to the level of the bit line BL1.

The search line pairs SL0-/SL0 and SL1-/SL1 are all set to "L" level. The match line ML need not be set to a particular level, but it is preferably kept precharged to "H" level.

With the word lines and other lines controlled as described above, mask data bit MD0 is written to the mask data cell MDC of the memory cell MC0#0 and mask data bit MD1 is written to mask data cell MDC of the memory cell MC1#0. When reading, the bit line potential difference is amplified by a sense amplifier (not shown) causing the mask data bits MD0 and MD1 to be read.

Next, data search operation will be described. In a data search, search data given by search lines is compared with the storage data stored at addresses #0 to #3 at a time and signals indicating whether or not the data stored in the memory cells at respective addresses match the search data are outputted in one operation cycle. In this case, the word lines WL0 to WL7 are all set to "L" level and the bit lines BL0 and BL1 are preferably set to "H" level.

The search line SL0 is set to a level corresponding to search data bit SD0, and the search line /SL0 is set to an inverted level with respect to the level of the search line SL0. Also, the search line SL1 is set to a level corresponding to search data bit SD1, and the search line /SL1 is set to an inverted level with respect to the level of the search line SL1. When, as a result, there is any memory cell corresponding to address #0 which does not match the search data, the precharged match line ML0 changes to "L" level based on wired-OR logic. When all data bits have matched the search data or when mask data has been written for all data bits, the precharged match line ML0 maintains the precharged state. As a result, output OUT is set to "H" level.

Figure 5:
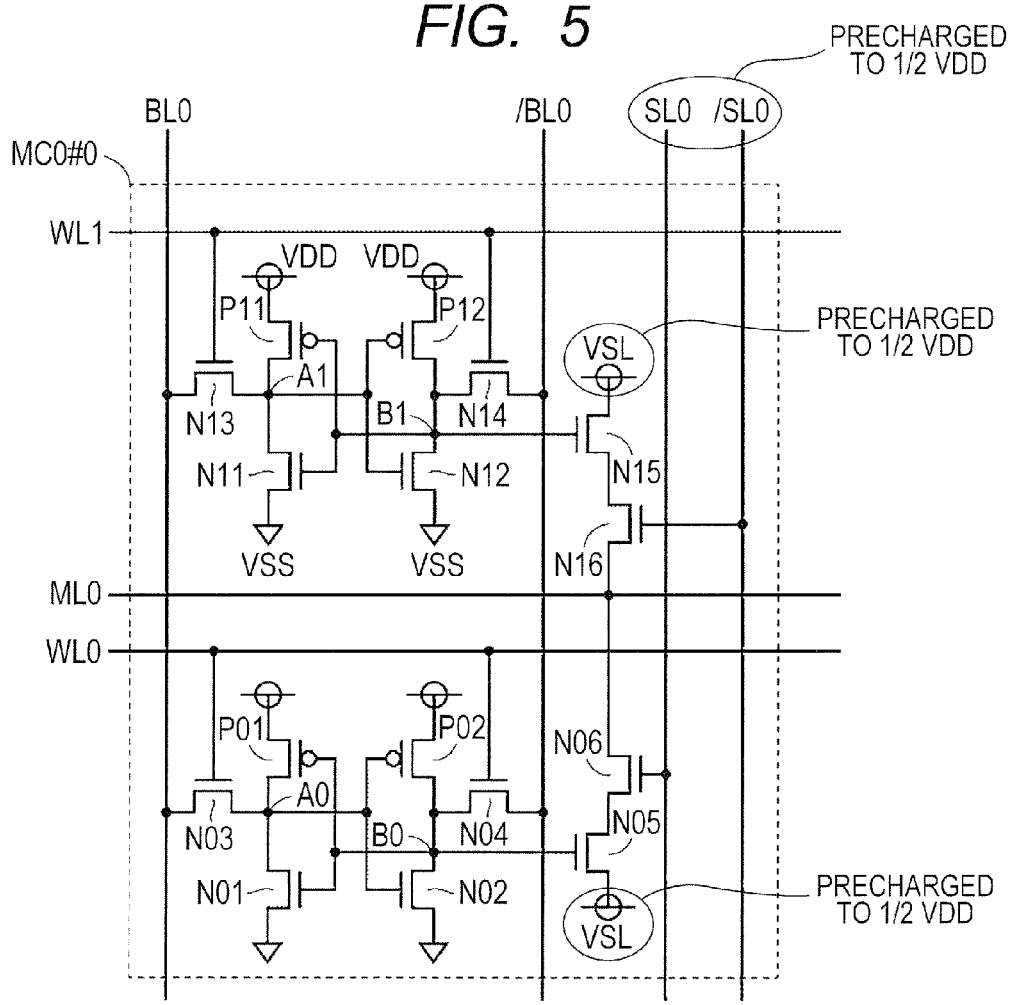
FIG. 5 is a diagram for explaining the potentials before a data search of the search line pairs and a power supply line VSL according to the first embodiment.

FIG. 5 is a diagram for explaining the potentials before a data search of the search line pairs and a power supply line VSL according to the first embodiment.

As shown in FIG. 5, before a data search, the power supply line VSL is precharged to ½ VDD. The search line pair SL0-/SL0 is also precharged to ½ VDD.

In this example case, in a state where the search line pair SL0-/SL0 has been precharged to ½ VDD, one of the two search lines and the other of the two search lines are set to the potential of the power supply line VDD and the potential of the ground line VSS, respectively.

Figure 6:
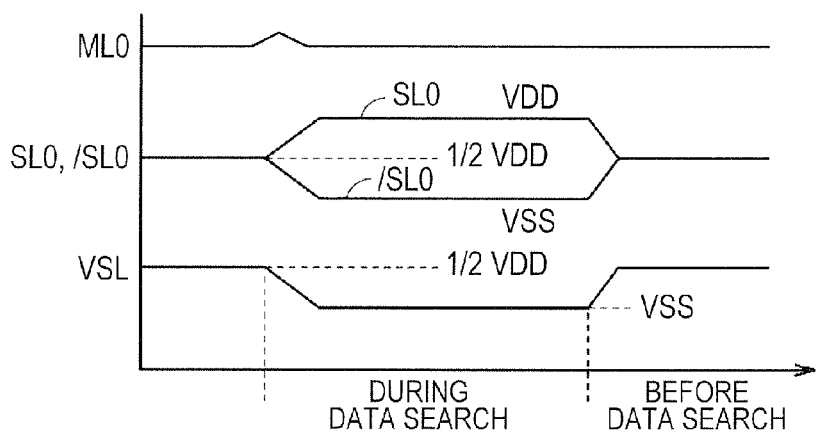
FIG. 6 is a diagram for explaining potential changes in a data search according to the first embodiment.

FIG. 6 is a diagram for explaining potential changes in a data search according to the first embodiment.

As shown in FIG. 6, in a state with the power supply line VSL and the search line pair SL0-SL0 precharged to ½ VDD before a data search, one and the other of the search lines SL0 and /SL0 are set to the potentials of the power supply line VDD and the ground line VSS, respectively, according to the search data.

Setting one of the search lines SL0 and /SL0 to the potential of the power supply line VDD generates coupling capacitance to raise the potential of the match line ML0, whereas setting the other of the search lines SL0 and /SL0 to the potential of the ground line VSS generates coupling capacitance to lower the potential of the match line ML0. Namely, the effects to raise and lower the potential of the match line ML0 are counterbalanced, so that variation in the potential of the match line ML0 can be inhibited.

Even when the number of memory cells coupled to the match line ML0 is increased, their effects to raise and lower the potential of the match line ML0 are counterbalanced, so that variation in the potential of the match line ML0 can be inhibited.

In the present example, the potential of the power supply line VSL is set to ½ VDD before a data search (in an initial state).

When, in the above state, memory nodes B0 and B1 are at "H" level corresponding to the data stored in the memory cell MC0#0, N-channel MOS transistor N05 coupled to the gate of the memory node B0 and N-channel MOS transistor N15 coupled to the gate of the memory node B1 become electrically continuous.

In the present example, the search line pair SL0-/SL0 is precharged to ½ VDD, so that, when the source voltage of each of the N-channel MOS transistors N06 and N16 is lower than the gate voltage, the N-channel MOS transistors N06 and N16 become electrically continuous.

Therefore, when the N-channel MOS transistors N05 and N15 and the N-channel MOS transistors N06 and N16 become electrically continuous, the potential of the match line ML0 is possibly coupled electrically with the power supply line VSL before a data search.

Therefore, in the present example, the potential of the power supply line VSL is set to ½ VDD before a data search so as not to allow the N-channel MOS transistors N06 and N16 become electrically continuous.

Subsequently, for a data search, the potential of the power supply line VSL is set to the potential of the ground line VSS.

Then, before a next data search, the potential of the power supply line VSL is again set to ½ VDD.

As for the search line pair SL0-/SL0, the equalizer circuit (EQ) is activated after a data search. This electrically couples the search lines SL0 and /SL0. As a result, one of the two search lines SL0 and /SL0 and the other of the two search lines are set to the potential of the power supply line VDD and the potential of the ground line VSS, respectively. This causes the two search lines to be coupled to each other and to be set to a potential of ½ VDD.

Therefore, it is not necessary to precharge the search lines after a data search. This saves power consumption for precharging the search line pair SL0-/SL0. Also, by electrically coupling the search lines SL0 and /SL0, the search lines SL0 and /SL0 can be set to an intermediate potential level between the power supply line VDD and the ground line VSS. This makes it unnecessary to prepare any precharge circuit, so that the number of components can be reduced.

Modification Example 1

Figure 7:
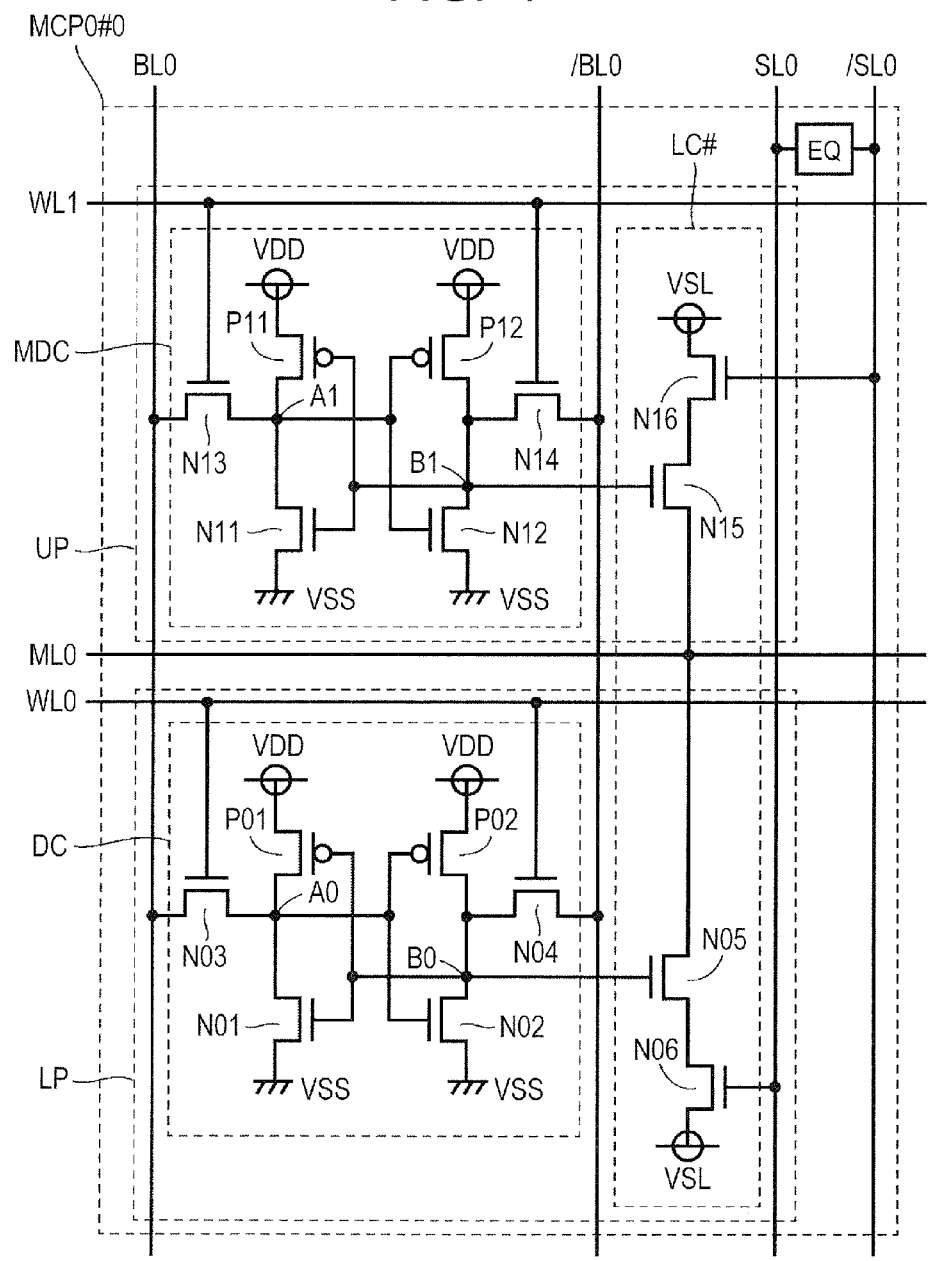
FIG. 7 is a circuit diagram showing the configuration of a memory cell MCP0#0 according to modification example 1 of the first embodiment.

FIG. 7 is a circuit diagram showing the configuration of a memory cell MCP0#0 according to modification example 1 of the first embodiment.

Referring to FIG. 7, the memory cell MCP0#0 includes a logic operation cell LC# instead of the logic operation cell LC included in the memory cell MC0#0.

Namely, in the memory cell MCP0#0, the N-channel MOS transistors N05 and N06 and also the N-channel MOS transistor N15 and N16 are coupled differently from the corresponding transistors in the memory cell MC0#0.

To be concrete, in the memory cell MCP0#0, the N-channel MOS transistor N05 is coupled to the match line ML0, and the N-channel MOS transistor N06 is coupled to the power supply line VSL.

Similarly, the N-channel MOS transistor N15 is coupled to the match line ML0, and the N-channel MOS transistor N16 is coupled to the power supply line VSL.

In this configuration, the N-channel MOS transistors coupled to the search lines SL0 and /SL0, respectively, are each coupled to the match line ML0 via another N-channel MOS transistor.

Therefore, when a potential rise is caused by coupling capacitance, it is conveyed to the match line ML0 via an N-channel MOS transistor.

In this regard, when search data matches data held at a memory node, the N-channel MOS transistors do not become electrically continuous, so that no potential rise due to coupling capacitance is conveyed to the match line ML0.

When search data does not match data held at a memory node, the N-channel MOS transistors become electrically continuous. In the case of a non-match, however, the match line ML0 is set to the potential of the ground line VSS, so that the match line ML0 is not affected by a potential rise caused by coupling capacitance.

Thus, in the above configuration, each N-channel MOS transistor coupled to a search line is coupled to the match line ML0 via another N-channel MOS transistor, so that the potential rise caused by coupling capacitance does not affect the match line ML0.

Second Embodiment

Figure 8:
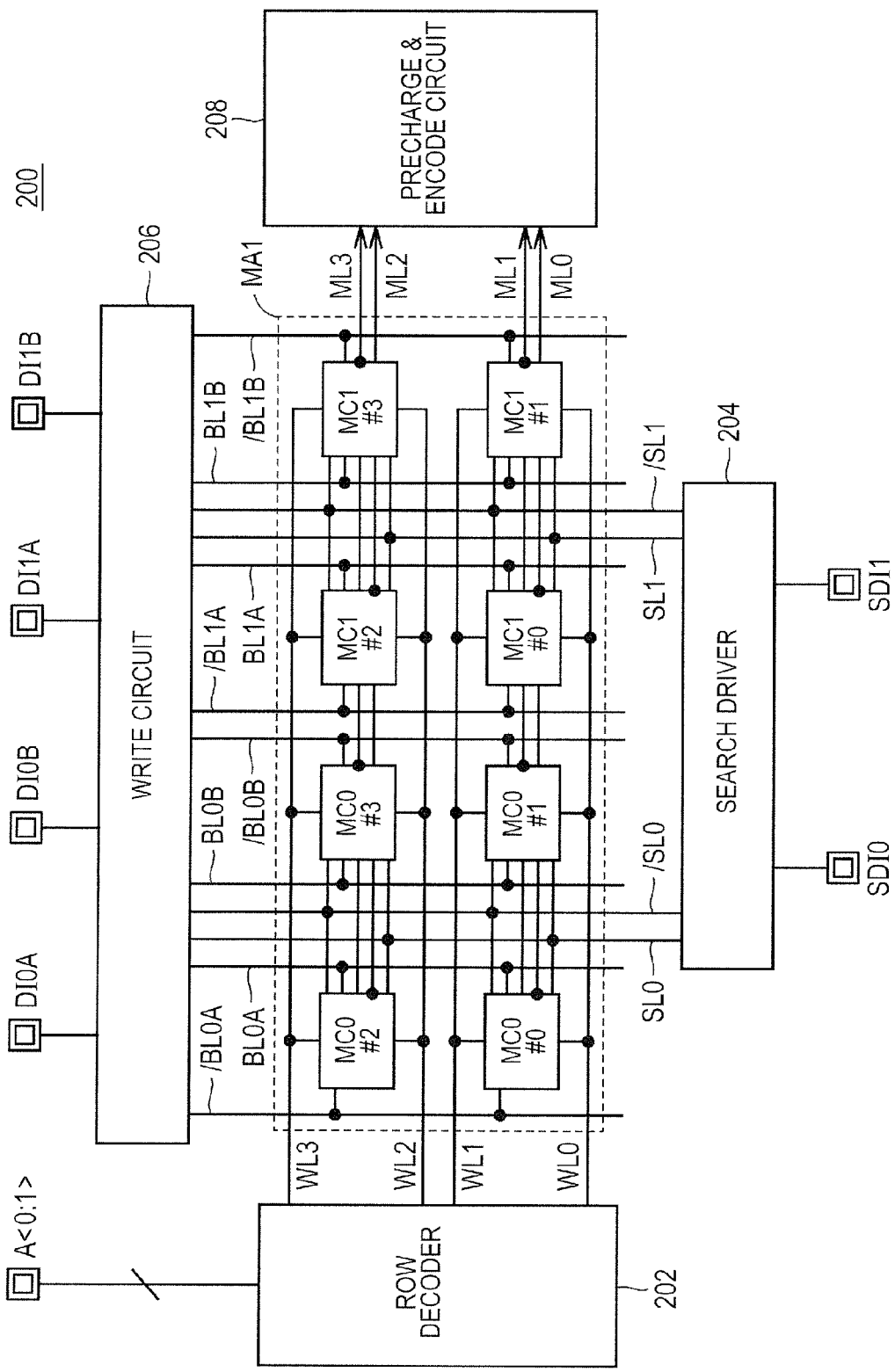
FIG. 8 is a block diagram showing an approximate configuration of a semiconductor memory device according to a second embodiment.

FIG. 8 is a block diagram showing an approximate configuration of a semiconductor memory device according to a second embodiment of the present disclosure.

Referring to FIG. 8, a semiconductor memory device 200 includes a row decoder 202 to selectively activate word lines WL0 to WL3 according to address signal A<0:1> and a search driver 204 to drive search line pairs SL0-/SL0 and SL1-/SL1 according to search data SDI0 and SDI1.

The semiconductor memory device 200 further includes a write circuit 206, a memory array MA1, and a precharge & encode circuit 208.

The write circuit 206 drives bit line pairs BL0A-/BL0A, BL0B-/BL0B, BL1A-/BL1A, and BL1B-BL1B according to input data DI0A and DI1A and also DI0B and DI1B.

The memory array MA1 includes plural memory cells arranged like a matrix, word lines WL0 to WL3, search line pairs SL0-/SL0 and SL1-/SL1 and bit line pairs BL0A-/BL0A, BL0B-/BL0B, BL1A-/BL1A, and BL1B-/BL1B.

The precharge & encode circuit 208 precharges match lines ML0 to ML3 extending from the memory array MA1 and encodes the results of matching outputted to the match lines.

The memory array MA1 has a physical configuration slightly modified from the array configuration of the first embodiment. The memory array MA1 includes TCAM cells arranged in two rows by four columns. Hence, the memory array MA1 is, in lateral width as seen in FIG. 8, two times the memory cell MA0 of the first embodiment shown in FIG. 1 and, in vertical width as seen in FIG. 8, one half the memory cell MA0.

The memory cells in the first row, i.e. the lower row, are assigned addresses #0 and #1. The memory cells in the second row, i.e. the upper row, are assigned addresses #2 and #3. In the second embodiment unlike in the first embodiment, each memory cell in each row is assigned an address number different from the address number assigned to the memory cell adjacent thereto on either side.

As for match lines, two match lines are provided for the four TCAM cells physically arranged in each row.

To be concrete, match lines ML0 and ML1 are provided for the memory cells arranged in the first row. Of the two match lines, the match line ML0 is coupled to the memory cells MC0#0 and MC1#0 corresponding to address #0. The match line ML1 is coupled to the memory cells MC0#1 and MC1#1 corresponding to address #1.

The match lines ML2 and ML3 are provided for the memory cells in the second row. Of the two match lines, the match line ML2 is coupled to the memory cells MC0#2 and MC1#2 corresponding to address #2. The match line ML3 is coupled to the memory cells MC0#3 and MC1#1 corresponding to address #3.

Namely, the two match lines provided for each row are each coupled to every other memory cell in the row.

Thus, the physical arrangement of the memory cells in the memory array MA1 of the second embodiment differs from that of the memory cells in the memory array MA0 of the first embodiment, but the memory array MA1 has the same search function as that of the memory array MA0.

Namely, in terms of the data search function, the semiconductor memory device 200 of the second embodiment also includes two search line pairs SL0-/SL0 and SL1-/SL1 and four match lines ML0 to ML3 and operates in the same manner as the semiconductor memory device 100 of the first embodiment.

As for data read and data write operations, the semiconductor memory device 200 of the second embodiment operates differently from the semiconductor memory device 100 of the first embodiment. In the first embodiment, the memory cells MC0#0 and MC0#1 are coupled to different word lines, so that it is not possible to write/read data to/from the two memory cells simultaneously. In the second embodiment, on the other hand, the memory cells MC0#0 and MC0#1 are coupled to the same word lines while being coupled to different bit line pairs. It is, therefore, possible to write/read data to/from the two memory cells simultaneously.

Since, in the second embodiment, data can be written/read to/from two addresses in one operation cycle, the number of operation cycles used for data writing can be reduced.

Also, compared with the first embodiment, the search line length can be halved in the second embodiment, so that wiring capacity can be kept small. This facilitates speeding up operation and reducing power consumption.

Figure 9:
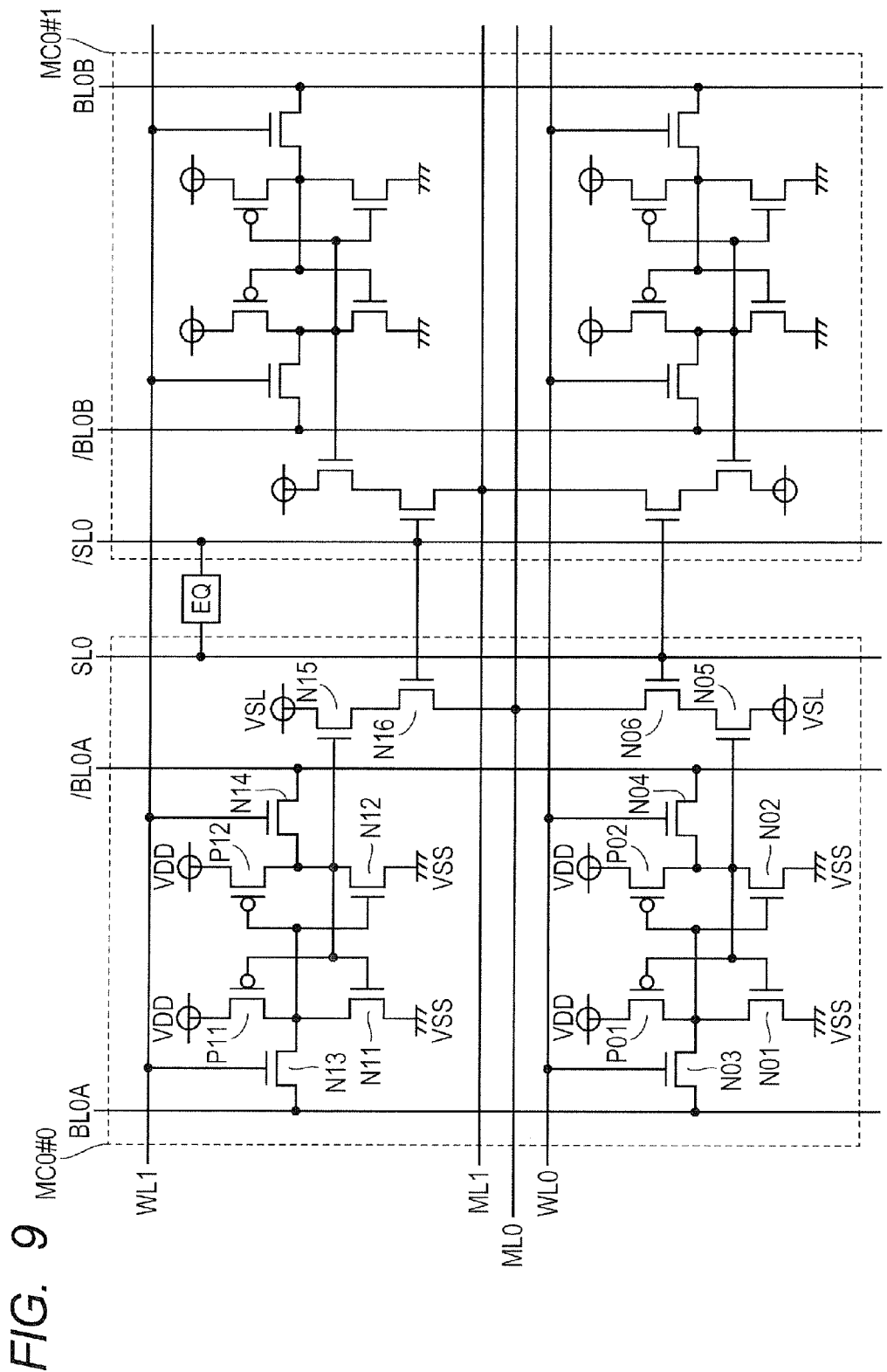
FIG. 9 is a circuit diagram showing the relationship between memory cells MC0#0 and MC0#1 adjacent to each other in memory array MA1.

FIG. 9 is a circuit diagram showing the relationship between the memory cells MC0#0 and MC0#1 adjacent to each other in the memory array MA1.

FIG. 10 is a diagram for explaining memory cell operation according to the second embodiment. In the following, the memory cell operation according to the second embodiment will be described in detail with reference to FIGS. 9 and 10.

When writing data to addresses #0 and #1 simultaneously, the word line WL0 is activated to "H" level and the word line WL1 is deactivated to "L" level. The word lines WL2 and WL3 corresponding to different addresses are deactivated to "L" level.

Bit line BL0A is set to a level corresponding to data D0#0 that is the 0th-bit data to be written to address #0. Bit line /BL0A is set to an inverted level with respect to the level of the bit line BL0A. Bit line BL0B is set to a level corresponding to data D0#1 that is the 0th-bit data to be written to address #1. Bit line /BL0B is set to an inverted level with respect to the level of the bit line BL0B.

Also, bit line BL1A is set to a level corresponding to data D1#0 that is the 1st-bit data to be written to address #0. Bit line /BL1A is set to an inverted level with respect to the level of the bit line BL1A.

Bit line BL1B is set to a level corresponding to data D1#1 that is the 1st-bit data to be written to address #1. Bit line /BL1B is set to an inverted level with respect to the level of the bit line BL1B.

When writing data, the search line pairs SL0-/SL0 and SL1-/SL1 are all deactivated to "L" level. The match line ML need not be set to a particular level, but it is preferably kept precharged to "H" level.

Next, the operation to write mask data to addresses #0 and #1 simultaneously will be described.

For this, the word line WL0 is deactivated to "L" level and the word line WL1 is activated to "H" level. The word lines WL2 and WL3 to which no data is to be written at this time are deactivated to "L" level.

The bit line BL0A is set to a level corresponding to data MD0#0 that is the 0th-bit mask data to be written to address #0. The bit line /BL0A is set to an inverted level with respect to the level of the bit line BL0A. The bit line BL0B is set to a level corresponding to data MD0#1 that is the 0th-bit mask data to be written to address #1. The bit line /BL0B is set to an inverted level with respect to the level of the bit line BL0B.

The bit line BL1A is set to a level corresponding to data MD1#0 that is the 1st-bit mask data to be written to address #0. The bit line /BL1A is set to an inverted level with respect to the level of the bit line BL1A. The bit line BL1B is set to a level corresponding to data MD1#1 that is the 1st-bit mask data to be written to address #1. The bit line /BL1B is set to an inverted level with respect to the level of the bit line BL1B.

At this time, the search lines SL0, /SL0, SL1, and /SL1 are in a deactivated state at "L" level. The match line ML need not be set to a particular level, but it is preferably kept precharged to "H" level.

On the other hand, when searching for data, all memory cells in the memory array MA1 are subjected to data comparison. For this, the word lines WL0 to WL3 are all deactivated to "L" level. The bit lines BL0A, BL0B, BL1A, BL1B, /BL0A, /BL0B, /BL1A, and /BL1B need not be set to a particular level, but they are preferably kept precharged to "H" level.

At this time, the search line SL0 is set to a level corresponding to data SD0 that is the 0th-bit search data. The search line /SL0 is set to an inverted level with respect to the level of the search line SL0. The search line SL1 is set to a level corresponding to data SD1 that is the 1st-bit search data. The search line /SL1 is set to an inverted level with respect to the level of the search line SL1.

The match line ML is set to "H" level when the search data completely matches the data stored at the corresponding addresses. When a non-match occurs at any one of the corresponding addresses, the precharged match line is discharged to output "L" level as an output signal OUT.

When mask data has been written at the corresponding addresses, the match line ML is set to "H" level like in the case of a complete match.

In the present example, in a state in which the search line pair SL0-/SL0 is precharged to ½ VDD, one of the search lines SL0 and /SL0 and the other of the search lines SL0 and /SL0 are set to the potentials of the power supply line VDD and the ground line VSS, respectively, according to the search data.

Setting one of the search lines SL0 and /SL0 to the potential of the power supply line VDD generates coupling capacitance to raise the potential of the match line ML0, whereas setting the other of the search lines SL0 and /SL0 to the potential of the ground line VSS generates coupling capacitance to lower the potential of the match line ML0. Namely, the effects to raise and lower the potential of the match line ML0 are counterbalanced, so that variation in the potential of the match line ML0 can be inhibited.

Even when the number of memory cells coupled to the match line ML0 is increased, their effects to raise and lower the potential of the match line ML0 are counterbalanced, so that variation in the potential of the match line ML0 can be inhibited.

In the present example, the potential of the power supply line VSL is set to ½ VDD before a data search so as not to allow the N-channel MOS transistors N06 and N16 become electrically continuous.

Subsequently, for a data search, the potential of the power supply line VSL is set to the potential of the ground line VSS.

Then, before a next data search, the potential of the power supply line VSL is again set to ½ VDD.

As for the search line pair SL0-/SL0, the equalizer circuit (EQ) is activated after a data search. This electrically couples the search lines SL0 and /SL0. As a result, one of the two search lines SL0 and /SL0 and the other of the two search lines are set to the potential of the power supply line VDD and the potential of the ground line VSS, respectively. This causes the two search lines to be set to a potential of ½ VDD.

Therefore, it is not necessary to precharge the search lines after a data search. This saves power consumption for precharging the search line pair SL0-/SL0. Also, by electrically coupling the search lines SL0 and /SL0, the search lines SL0 and /SL0 can be set to an intermediate potential level between the power supply line VDD and the ground line VSS. This makes it unnecessary to prepare any precharge circuit, so that the number of components can be reduced.

FIGS. 11 to 15 are approximate plan views showing approximate memory array layout configurations over different layers according to a second embodiment of the present disclosure.

Figure 11:
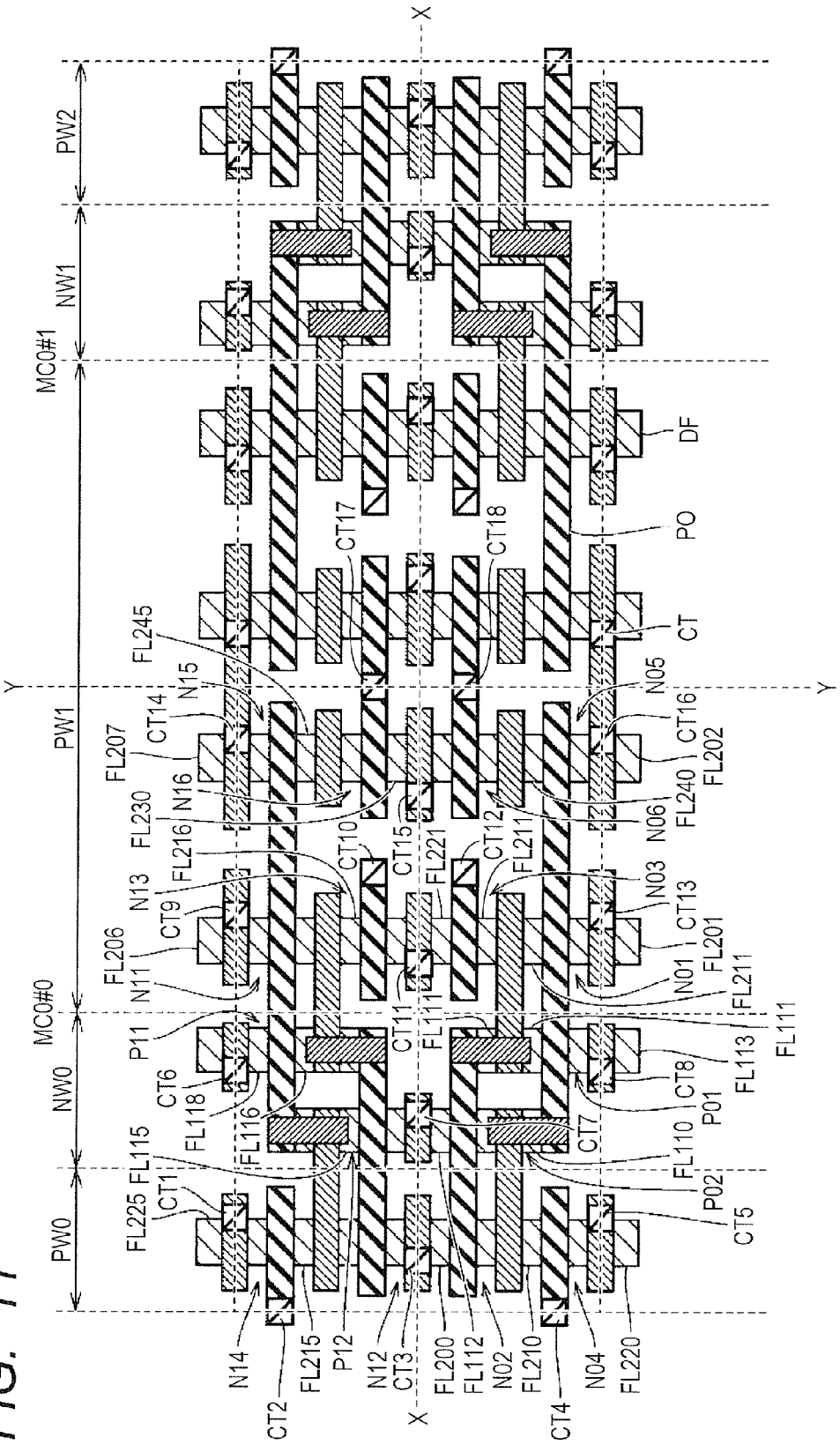
FIG. 11 is a plan view showing the layout of wells, diffusion regions FL, polysilicon P0, and contact holes CT in the memory array according to the second embodiment.

FIG. 11 is a plan view showing the layout of wells, diffusion regions FL, polysilicon PO, and contact holes CT in the memory array according to the second embodiment.

FIG. 11 shows two TCAM cell bits, i.e. the memory cells MC0#0 and MC0#1 adjacent to each other in the X direction. Note that, as for the contact holes CT, polysilicon PO, and diffusion regions FL included in the memory cell MC0#1 shown in FIG. 11, only one each of them is representatively denoted by a symbol.

The memory cells MC0#0 and MC0#1 are each divided by an X axis into a data bit and a mask bit. The data bit and the mask bit can be laid out similarly to the layout of an existing type of single-port SRAM configured with six transistors.

The memory cell MC0#0 has an N-well NW0 in a central portion thereof in the X direction, and P-channel MOS transistors are formed in the N-well NW0. There are P-well PW0 and PW1 formed on both sides of the N-well NW0. In each of the P-wells PW0 and PW1, N-channel MOS transistors are formed. The search transistors for the data search function are formed by N-channel MOS transistors in the P-well PW1. The wells extend in the same direction as the bit lines and search lines to be also used for other memory cells in the same column. The direction in which the wells extend is perpendicular to the direction in which the word lines and match lines extend.

To be more specific, the memory cell MC0#0 formed on the semiconductor substrate surface includes one N-well NW0 and two P-wells PW0 and PW1 formed on both sides of the N-well NW0. The memory cell MC0#1 is formed to be line-symmetric to the memory cell MC0#0 with respect to the Y axis and shares the P-well PW1 with the memory cell MC0#0. The memory cell MC0#1 includes the N-well NW1 and P-well PW2 corresponding to the N-well NW0 and P-well PW0, respectively.

The P-channel MOS transistors P01 and P02 are formed corresponding to the data cell DC in the N-well NW0. The N-channel MOS transistors N02 and N04 are formed in the P-well PW0. The N-channel MOS transistors N01, N03, N05, and N06 are formed in the P-well PW1.

The N-channel MOS transistor N01 has a source and a drain formed of a pair of N-type diffusion regions FL201 and FL211 and a polysilicon gate formed between them. The N-type diffusion region FL201 is electrically coupled to the ground line VSS via a contact hole CT.

The N-channel MOS transistor N03 has a source and a drain formed of a pair of N-type diffusion regions FL221 and FL211 and a polysilicon gate formed between them. The gate is electrically coupled to the word line WL0 via a contact hole CT. The N-type diffusion region FL221 is electrically coupled to the bit line BL0 via a contact hole CT.

The N-channel MOS transistor N04 has a source and a drain formed of a pair of N-type diffusion regions FL220 and FL210 and a polysilicon gate formed between them. The gate is electrically coupled to the word line WL0 via a contact hole CT. The N-type diffusion region FL220 is electrically coupled to the bit line /BL0 via a contact hole CT.

The N-channel MOS transistor N02 has a source and a drain formed of a pair of N-type diffusion regions FL200 and FL210 and a polysilicon gate formed between them. The N-type diffusion region FL200 is electrically coupled to the ground line VSS via a contact hole CT.

The P-channel MOS transistor P01 has a source and a drain formed of a pair of P-type diffusion regions FL113 and FL111 and a polysilicon gate formed between them. The gate is formed of polysilicon continuous from the gate of the N-channel MOS transistor N01. The P-type diffusion region FL113 is electrically coupled to the power supply line VDD via a contact hole CT.

The P-channel MOS transistor P02 has a source and drain formed of a pair of P-type diffusion regions FL110 and FL112 and a polysilicon gate formed between them. The gate is formed of polysilicon continuous from the gate of the N-channel MOS transistor N02 and is electrically coupled to the P-type diffusion region FL111 via a contact hole CT. The P-type diffusion region FL112 is electrically coupled to the power supply line VDD via a contact hole CT. The P-type diffusion region FL110 is electrically coupled to the polysilicon gate of the P-channel MOS transistor P01 via a contact hole CT.

The N-channel MOS transistor N05 has a source and a drain formed of a pair of N-type diffusion regions FL240 and FL202 and a polysilicon gate formed between them. The gate is formed of the polysilicon also serving as the gates of the P-channel MOS transistor P01 and N-channel MOS transistor N01. The N-type diffusion region FL202 is electrically coupled to the ground line VSS via a contact hole CT.

The N-channel MOS transistor N06 has a source and a drain formed of a pair of N-type diffusion regions FL230 and FL240 and a polysilicon gate formed between them. The gate is electrically coupled to the search line SL0 via a contact hole CT. The N-type diffusion region FL230 is electrically coupled to the match line ML via a contact hole CT.

The P-channel MOS transistors P11 and P12 are formed corresponding to the mask data cell MDC in the N-well NW0. The N-channel MOS transistors N12 and N14 are formed in the P-well PW0. The N-channel MOS transistors N11, N13, N15, and N16 are formed in the P-well PW1. The N-channel MOS transistor N11 has a source and a drain formed of a pair of N-type diffusion regions FL206 and FL216 and a polysilicon gate formed between them. The N-type diffusion region FL206 is electrically coupled to the ground line VSS via a contact hole CT.

The N-channel MOS transistor N13 has a source and a drain formed of a pair of N-type diffusion regions FL221 and FL216 and a polysilicon gate formed between them. The gate is electrically coupled to the word line WL1 via a contact hole CT. The N-type diffusion region FL221 is, as stated above, electrically coupled to the bit line BL0 via a contact hole CT.

The N-channel MOS transistor N14 has a source and a drain formed of a pair of N-type diffusion regions FL225 and FL215 and a polysilicon gate formed between them. The gate is electrically coupled to the word line WL1 via a contact hole CT. The N-type diffusion region FL225 is electrically coupled to the bit line /BL0 via a contact hole CT.

The N-channel MOS transistor N12 has a source and a drain formed of a pair of N-type diffusion regions FL200 and FL215 and a polysilicon gate formed between them. The N-type diffusion region FL200 is, as stated in the foregoing, electrically coupled to the ground line VSS via a contact hole CT.

The P-channel MOS transistor P11 has a source and a drain formed of a pair of P-type diffusion regions FL118 and FL116 and a polysilicon gate formed between them. The gate is formed of polysilicon continuous from the gate of the N-channel MOS transistor N11. The P-type diffusion region FL118 is electrically coupled to the power supply line VDD via a contact hole CT.

The P-channel MOS transistor P12 has a source and a drain formed of a pair of P-type diffusion regions FL115 and FL112 and a polysilicon gate formed between them. The gate is formed of polysilicon continuous from the gate of the N-channel MOS transistor N12 and is electrically coupled to the P-type diffusion region FL116 via a contact hole CT. The P-type diffusion region FL112 is, as stated in the foregoing, electrically coupled to the power supply line VDD via a contact hole CT. The P-type diffusion region FL115 is electrically coupled to the polysilicon gate of the P-channel MOS transistor P11 via a contact hole CT.

The N-channel MOS transistor N15 has a source and a drain formed of a pair of N-type diffusion regions FL245 and FL207 and a polysilicon gate formed between them. The gate is formed of the polysilicon also used as the gates of the P-channel MOS transistor P11 and the N-channel MOS transistor N11. The N-type diffusion region FL207 is electrically coupled to the ground line VSS via a contact hole CT.

The N-channel MOS transistor N16 has a source and a drain formed of a pair of N-type diffusion regions FL230 and FL245 and a polysilicon gate formed between them. The gate is electrically coupled to the search line /SL0 via a contact hole CT. The N-type diffusion region FL230 is, as stated in the foregoing, electrically coupled to the match line ML via a contact hole CT.

The N-type diffusion regions are each formed by injecting N-type impurities into active regions in the P-wells PW0, PW1, and PW2. The P-type diffusion regions are each formed by injecting P-type impurities into active regions in the N-wells NW0 and NW1.

In the memory cell MC0#1, transistors and diffusion regions are laid out line-symmetrically to those in the memory cell MC0#0 with respect to the Y axis, so that their layout will not be further described herein.

Figure 12:
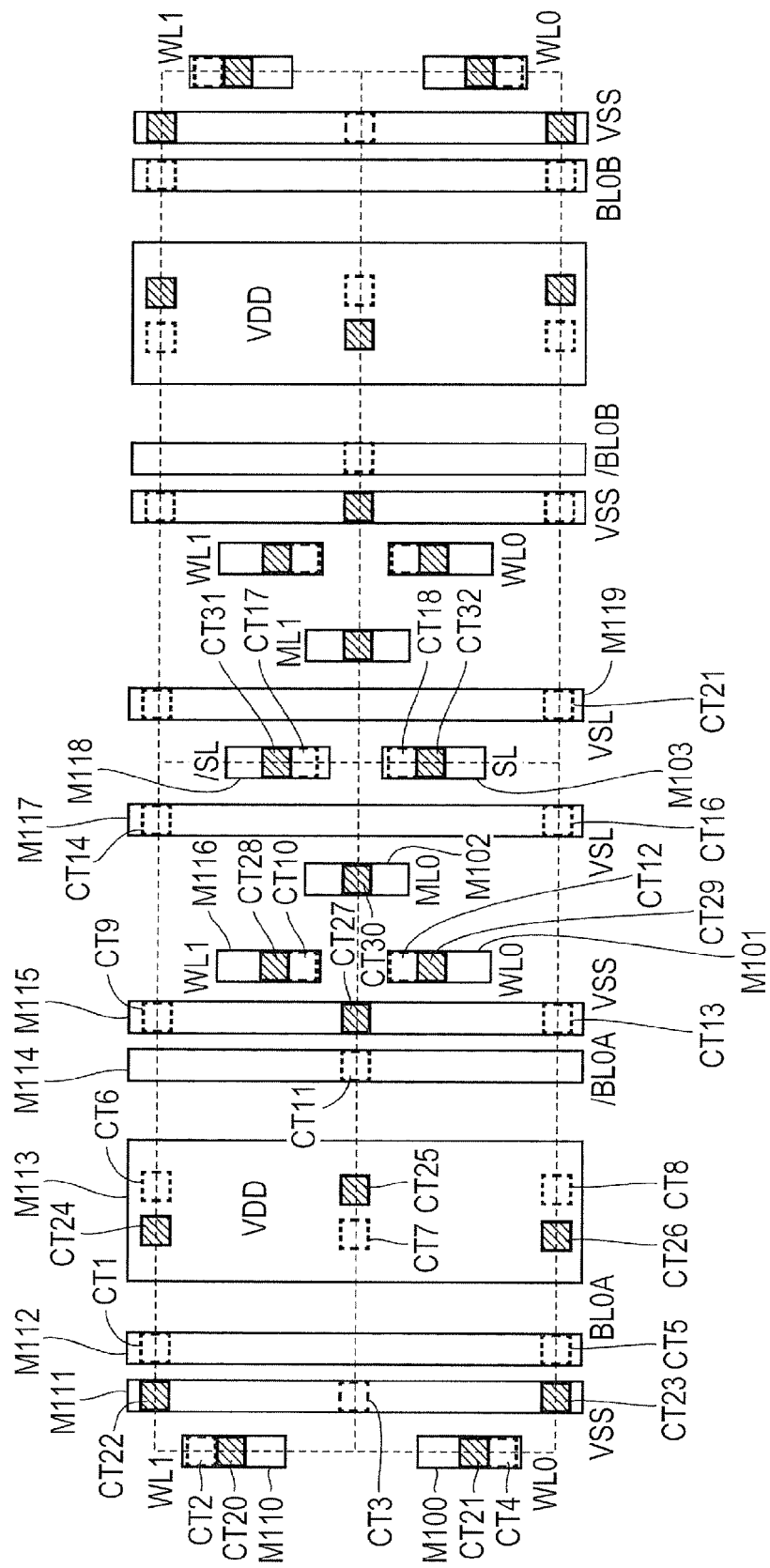
FIG. 12 is a plan view showing the layout of contact holes CT formed, for coupling to first and second metal wiring layers, in the memory array according to the second embodiment.

FIG. 12 is a plan view showing the layout of contact holes CT formed in the memory array according to the second embodiment. The contact holes are for coupling to first and second metal wiring layers.

In FIG. 12, the contact holes CT shown in dotted lines are for coupling to a lower layer, and the contact holes CT shown in solid lines are for coupling to an upper layer. This also applies to the subsequent drawings. In the example shown in FIG. 12, first metal wiring layers 100 to 119 are laid out along the Y axis.

The gate of the N-channel MOS transistor N04 is coupled to the first metal wiring layer M100 via a contact hole CT4. The first metal wiring layer M100 is coupled to a second metal wiring layer via a contact hole CT21.

The source of the N-channel MOS transistor N04 is coupled to the first metal wiring layer M112 forming the bit line BL via a contact hole CT5.

The source of the N-channel MOS transistor N14 is coupled to the first metal wiring layer M112 forming the bit line BL via a contact hole CT1.

The gate of the N-channel MOS transistor N14 is coupled to the first metal wiring layer M110 via a contact hole CT2. The first metal wiring layer M110 is coupled to a second metal wiring layer via a contact hole CT20.

The N-type diffusion region FL200 forming the drains of the N-channel MOS transistor N12 and N-channel MOS transistor N02 is coupled to the first metal wiring layer M111 via a contact hole CT3. The first metal wiring layer M111 is coupled to the ground line (VSS) formed over a second metal wiring layer via contact holes CT22 and CT23.

The P-type diffusion region FL113 forming the source of the P-channel MOS transistor P01 is coupled to the first metal wiring layer M113 via a contact hole CT8.

The P-type diffusion region FL118 forming the source of the P-channel MOS transistor P11 is coupled to the first metal wiring layer M113 via a contact hole CT6.

The P-type diffusion region FL112 forming the sources of the P-channel MOS transistors P12 and P02 is coupled to the first metal wiring layer M113 via a contact hole CT7.

The first metal wiring layer M113 is coupled to the power supply line (VDD) formed over a second metal wiring layer via contact holes CT24 to CT26.

The source of the N-channel MOS transistor N01 is coupled to the first metal wiring layer M115 via a contact hole CT13. The first metal wiring layer M115 is coupled to the ground line (VSS) formed over a second metal wiring layer via a contact hole CT27.

The N-type diffusion region FL221 forming the drain of the N-channel MOS transistors N03 and N13 is coupled to the first metal wiring layer M114 forming the bit line /BL via a contact hole CT11.

The source of the N-channel MOS transistor N11 is coupled to the first metal wiring layer M115 via a contact hole CT9.

The gate of the N-channel MOS transistor N13 is coupled to the first metal wiring layer M116 via a contact hole CT10. The first metal wiring layer M116 is coupled to a metal wiring layer forming a word line via a contact hole CT28.

The gate of the N-channel MOS transistor N03 is coupled to the first metal wiring layer M101 via a contact hole CT12. The first metal wiring layer M101 is coupled to a metal wiring layer forming a word line via a contact hole CT29.

The source of the N-channel MOS transistor N15 is coupled to the power supply line (VSL) formed over the first metal wiring layer M117 via a contact hole CT14.

The source of the N-channel MOS transistor N05 is coupled to the power supply line (VSL) formed over the first metal wiring layer M117 via a contact hole CT16.

The N-type diffusion region FL230 forming the drains of the N-channel MOS transistors N06 and N16 is coupled to the first metal wiring layer M102 via a contact hole CT15. The first metal wiring layer M102 is coupled to a metal wiring layer forming a match line via a contact hole CT30.

The gate of the N-channel MOS transistor N16 is coupled to the first metal wiring layer M118 via a contact hole CT17. The first metal wiring layer M118 is coupled to the metal wiring layer forming the upper-layer search line /SL via a contact hole CT31.

The gate of the N-channel MOS transistor N06 is coupled to the first metal wiring layer M103 via a contact hole CT18. The first metal wiring layer M103 is coupled to the metal wiring layer forming the upper-layer search line SL via a contact hole CT32.

The bit line pairs BL0A-/BL0A and BL0B-/BL0B and the power supply line VSL are formed over first metal wiring layers.

Figure 13:
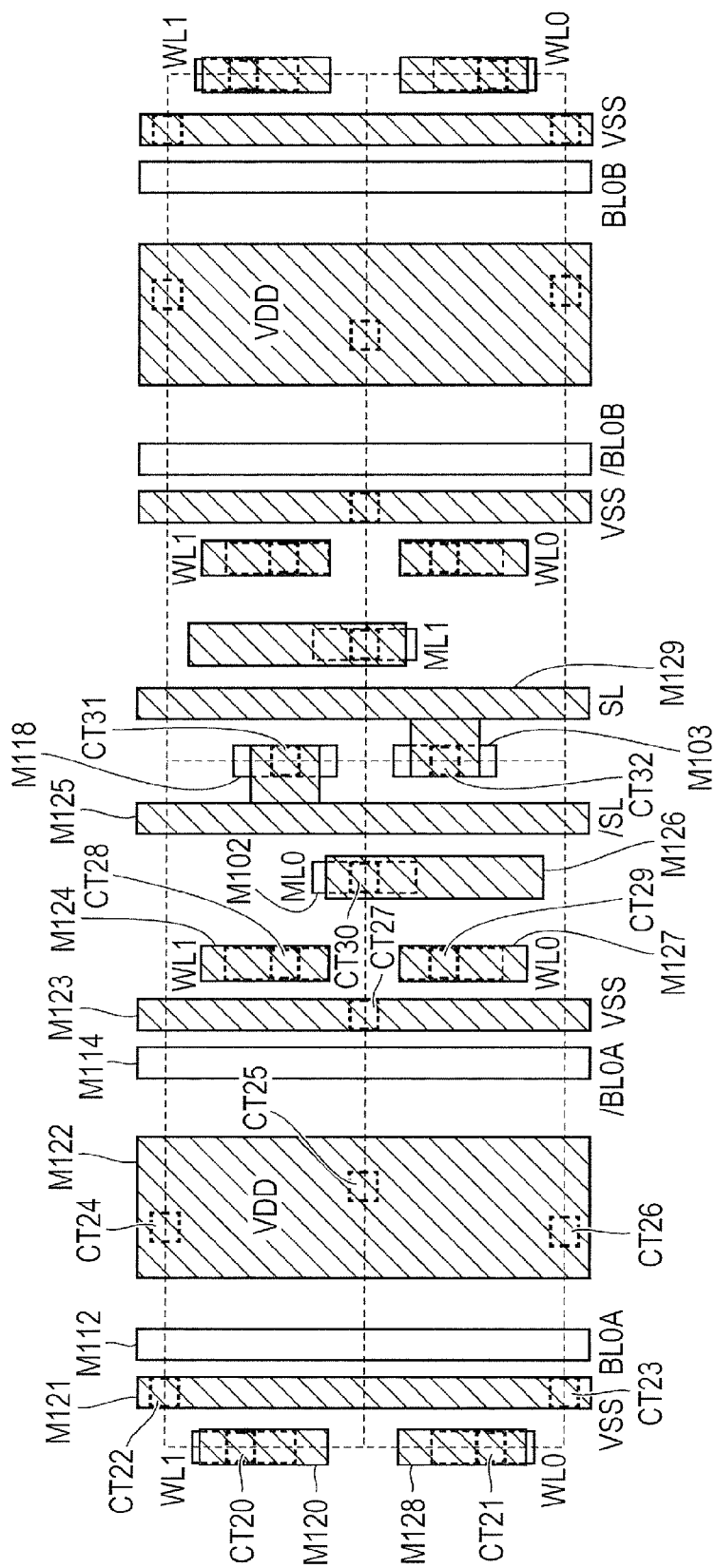
FIG. 13 is a plan view showing the layout of contact holes CT and second metal wiring layers in the memory array according to the second embodiment.

FIG. 13 is a plan view showing the layout of contact holes CT and second metal wiring layers in the memory array according to the second embodiment.

In the example shown in FIG. 13, second metal wiring layers 120 to 129 are laid out along the Y axis.

The second metal wiring layer M120 is coupled to the first metal wiring layer M110 via the contact hole CT20. The second metal wiring layer M120 is coupled to the metal wiring layer forming the upper-layer word line WL1 via a contact hole CT.

The second metal wiring layer M128 is coupled to the first metal wiring layer M100 via the contact hole CT21. The second metal wiring layer M128 is coupled to the metal wiring layer forming the upper-layer word line WL0 via a contact hole CT.

The second metal wiring layer M121 is coupled to the first metal wiring layer M111 via the contact holes CT22 and CT23. The second metal wiring layer M121 forms the ground line VSS.

The second metal wiring layer M122 is coupled to the first metal wiring layer M113 via the contact holes CT24 to CT26. The second metal wiring layer M122 forms the power supply line VDD.

The second metal wiring layer M123 is coupled to the first metal wiring layer M115 via the contact hole CT27. The second metal wiring layer M123 forms the ground line VSS.

The second metal wiring layer M124 is coupled to the first metal wiring layer M116 via the contact hole CT28. The second metal wiring layer M124 is coupled to the metal wiring layer forming the upper-layer word line WL1 via a contact hole CT.

The second metal wiring layer M127 is coupled to the first metal wiring layer M101 via the contact hole CT29. The second metal wiring layer M127 is coupled to the metal wiring layer forming the upper-layer word line WL0 via a contact hole CT.

The second metal wiring layer M126 is coupled to the first metal wiring layer M102 via the contact hole CT30. The second metal wiring layer M126 is coupled to the metal wiring layer forming the upper-layer match line WL0 via a contact hole CT.

The second metal wiring layer M125 is coupled to the first metal wiring layer M118 via the contact hole CT31. The second metal wiring layer M125 forms the search line /SL.

The second metal wiring layer M129 is coupled to the first metal wiring layer M103 via the contact hole CT32. The second metal wiring layer M129 forms the search line SL.

The ground line VSS, power supply line VDD, and a search line pair SL-/SL are formed over second metal wiring layers.

Figure 14:
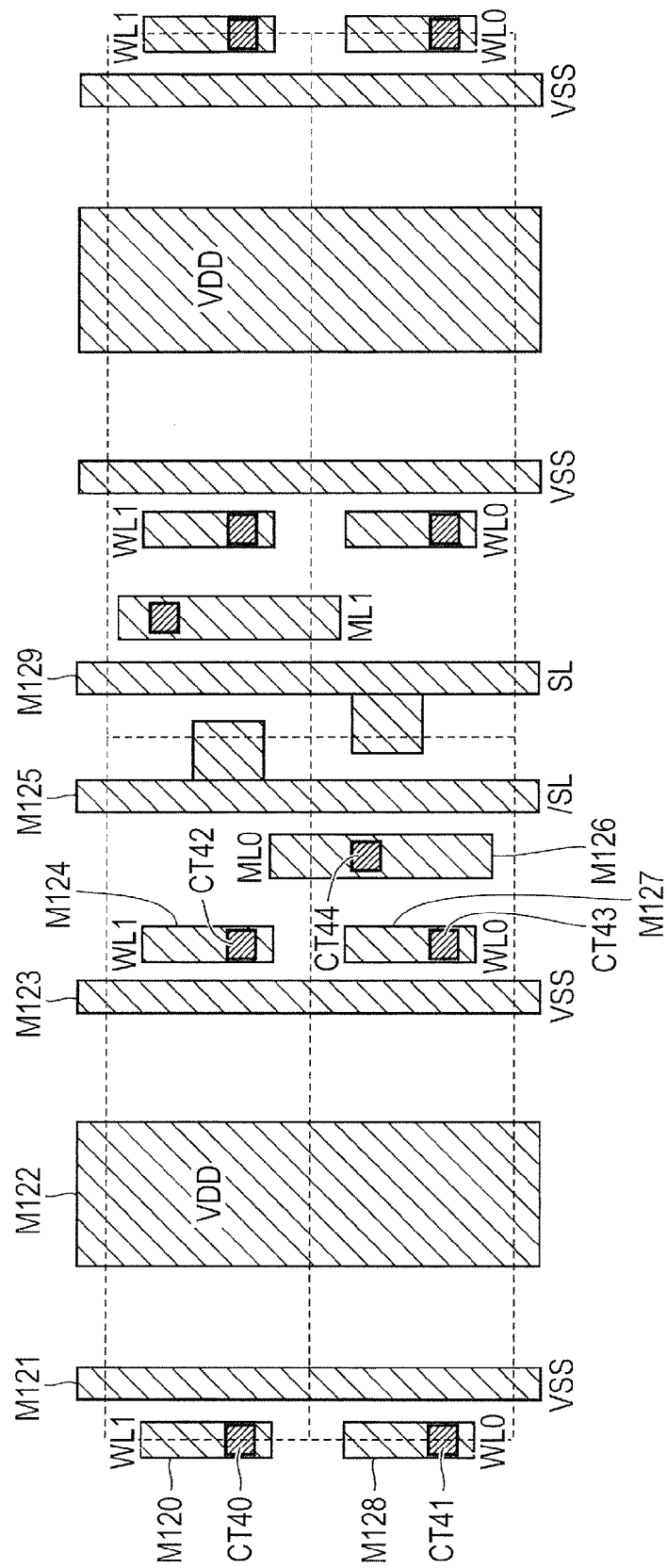
FIG. 14 is a plan view showing the layout of contact holes formed for coupling between second metal wiring layers and upper layers according to the second embodiment.

FIG. 14 is a plan view showing the layout of contact holes formed for coupling between second metal wiring layers and upper layers according to the second embodiment.

As shown in FIG. 14, the second metal wiring layer M120 is coupled, via a contact hole CT40 formed therein, to the word line WL1 formed over a third metal wiring layer.

The second metal wiring layer M128 is coupled, via a contact hole CT41 formed therein, to the word line WL0 formed over a third metal wiring layer.

The second metal wiring layer M124 is coupled, via a contact hole CT42 formed therein, to the word line WL1 formed over a third metal wiring layer.

The second metal wiring layer M127 is coupled, via a contact hole CT43 formed therein, to the word line WL0 formed over a third metal wiring layer.

The second metal wiring layer M126 is coupled, via a contact hole CT44 formed therein, to the match line ML0 formed over a third metal wiring layer.

Figure 15:
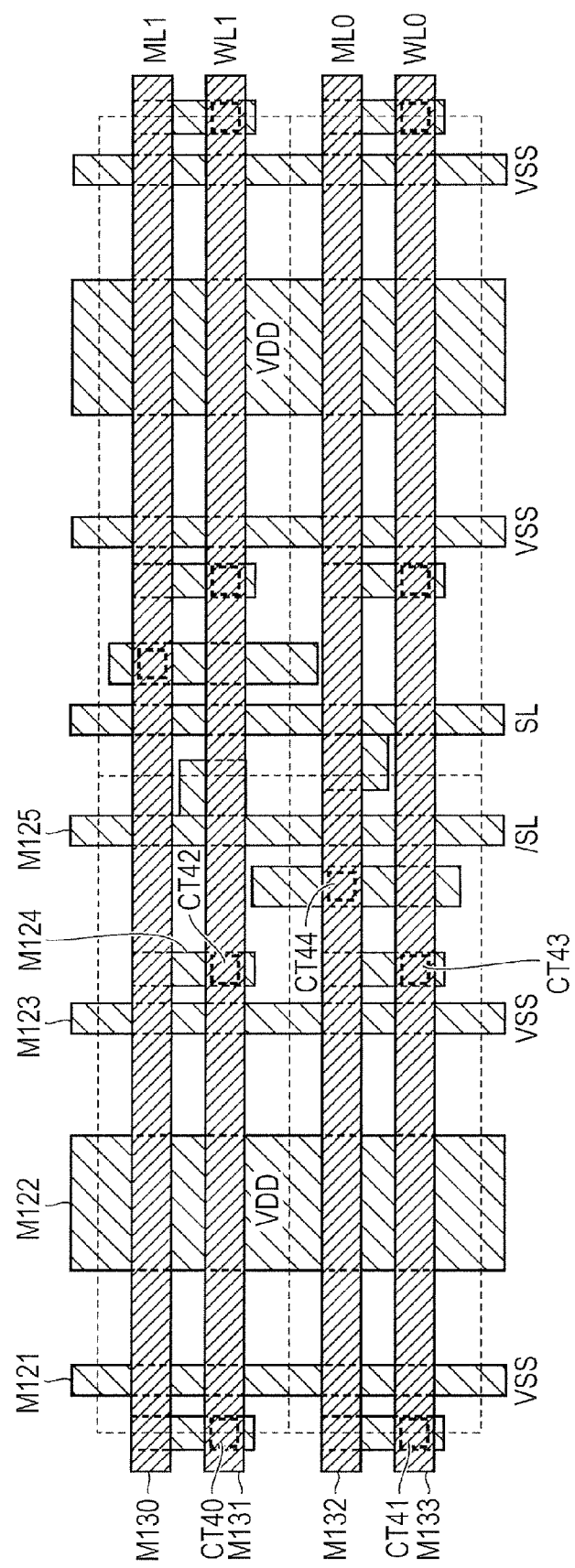
FIG. 15 is a plan view showing the layout of third metal wiring layers and contact holes according to the second embodiment.

FIG. 15 is a plan view showing the layout of third metal wiring layers and contact holes according to the second embodiment.

In the example shown in FIG. 15, third metal wiring layers M130 to M133 are laid out along the X axis.

The third metal wiring layer M130 forms the match line ML1.

The third metal wiring layer M131 forms the word line WL1 and is coupled to the contact holes CT40 and CT42.

The third metal wiring layer M132 forms the match line ML0 and is coupled to the contact hole CT44.

The third metal wiring layer M133 forms the word line WL0 and is coupled to the contact holes CT41 and CT43.

The word lines WL0 and WL1 and the match lines ML0 and ML1 are formed over third metal wiring layers.

As for the internal metal wiring layers of the memory cell MC0#1, search lines and bit lines corresponding to the search lines SL and bit lines BL coupled to the memory cell MC0#0 are coupled to the memory cell MC0#1. In other respects, the wiring patterns in the memory cell MC0#1 are laid out line-symmetrically to those in the memory cell MC0#0 with respect to the Y axis, so that their layout will not be further described herein.

The above-described layout makes it possible to realize a TCAM memory array using first to third metal wiring layers. By keeping the number of wiring layers small, the manufacturing cost can be reduced.

The gates of the transistors shown in FIG. 5 can be oriented along the X axis. This makes it possible to reduce processing variations, for example, resulting from uneven etching or transistor size variations caused by mask alignment errors.

Furthermore, since the bit lines and search lines can be made shorter, the wiring capacity can be reduced. Hence, the power consumption by charging and discharging of the bit lines and search lines can be reduced. A smaller wiring capacity is also advantageous in increasing the operating speed.

Third Embodiment

Regarding the foregoing first embodiment, a system has been described in which the voltage variation in the match line ML attributable to the coupling capacitance between the search line pair SL-/SL and the match line ML is reduced by precharging the search line pair SL-/SL to ½VDD.

On the other hand, the voltage variation in the match line ML caused by the coupling capacitance between the search line pair SL-/SL and the match line ML can be used for data reading.

Figure 16A:
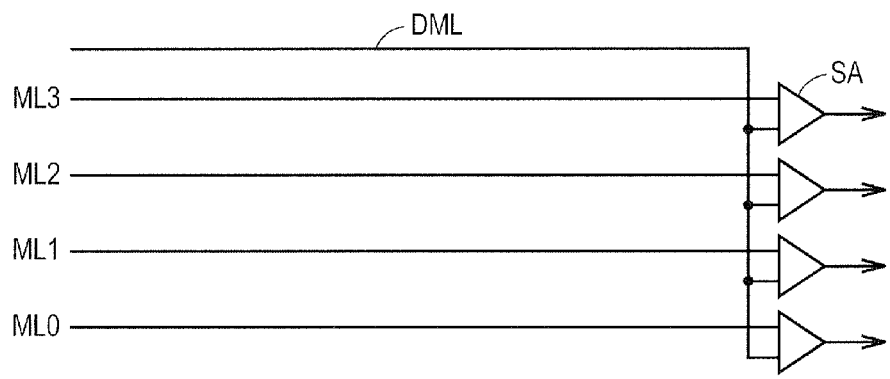
FIGS. 16A and 16B are diagrams for explaining a circuit configuration for data reading in a precharge & encode circuit 108 according to a third embodiment.
Figure 16B:
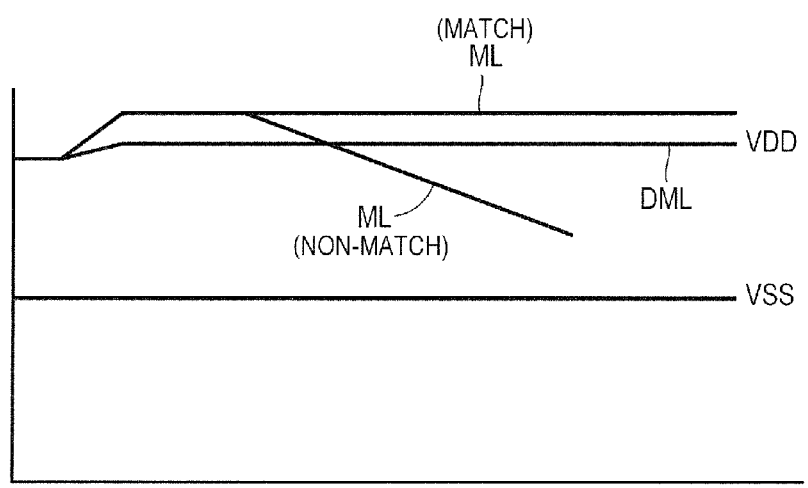

FIGS. 16A and 16B are diagrams for explaining a circuit configuration for data reading in a precharge & encode circuit 108 according to a third embodiment.

As shown in FIG. 16A, four sense amplifiers SA are provided corresponding to four match lines ML0 to ML3.

Each sense amplifier SA amplifies the potential difference between the corresponding match line and a dummy match line DML and outputs the amplified potential difference.

The dummy match line DML is provided to set a reference potential for each sense amplifier SA and is set to the potential of the power supply line VDD.

Each sense amplifier SA detects and amplifies the potential difference between the corresponding one of the match lines ML0 to ML3 and the power supply line VDD, and outputs the amplified potential difference.

When the corresponding match line ML is in a matching state as shown in FIG. 16B, its potential is above the precharged potential of the power supply line VDD.

On the other hand, when the corresponding match line ML enters a non-matching state, its potential drops toward the ground voltage VSS.

When the corresponding match line ML is in a matching state, the difference between its potential that has risen above the potential of the dummy match line DML and the potential of the dummy match line DML set to the potential of the power supply line VDD is amplified, and the amplified potential difference is outputted.

When the corresponding match line ML is in a non-matching state, its potential drops below the potential of the power supply line VDD, and the difference between its potential and the potential of the power supply line VDD is amplified. The amplified potential difference is then outputted.

The configuration according to the third embodiment makes it possible to use the potential of the power supply line VDD as the reference voltage for the sense amplifiers SA.

Therefore, it is not necessary to provide a reference voltage generation circuit to generate a reference voltage for the sense amplifiers SA. This makes it possible to reduce the number of components and to perform data reading using a simplified configuration.

Fourth Embodiment

In the following, a system for controlling mask bit columns will be described as a fourth embodiment of the present disclosure.

A mask bit column masks a column of bits not to be subjected to comparison to determine matches/non-matches in a data search.

Figure 17:
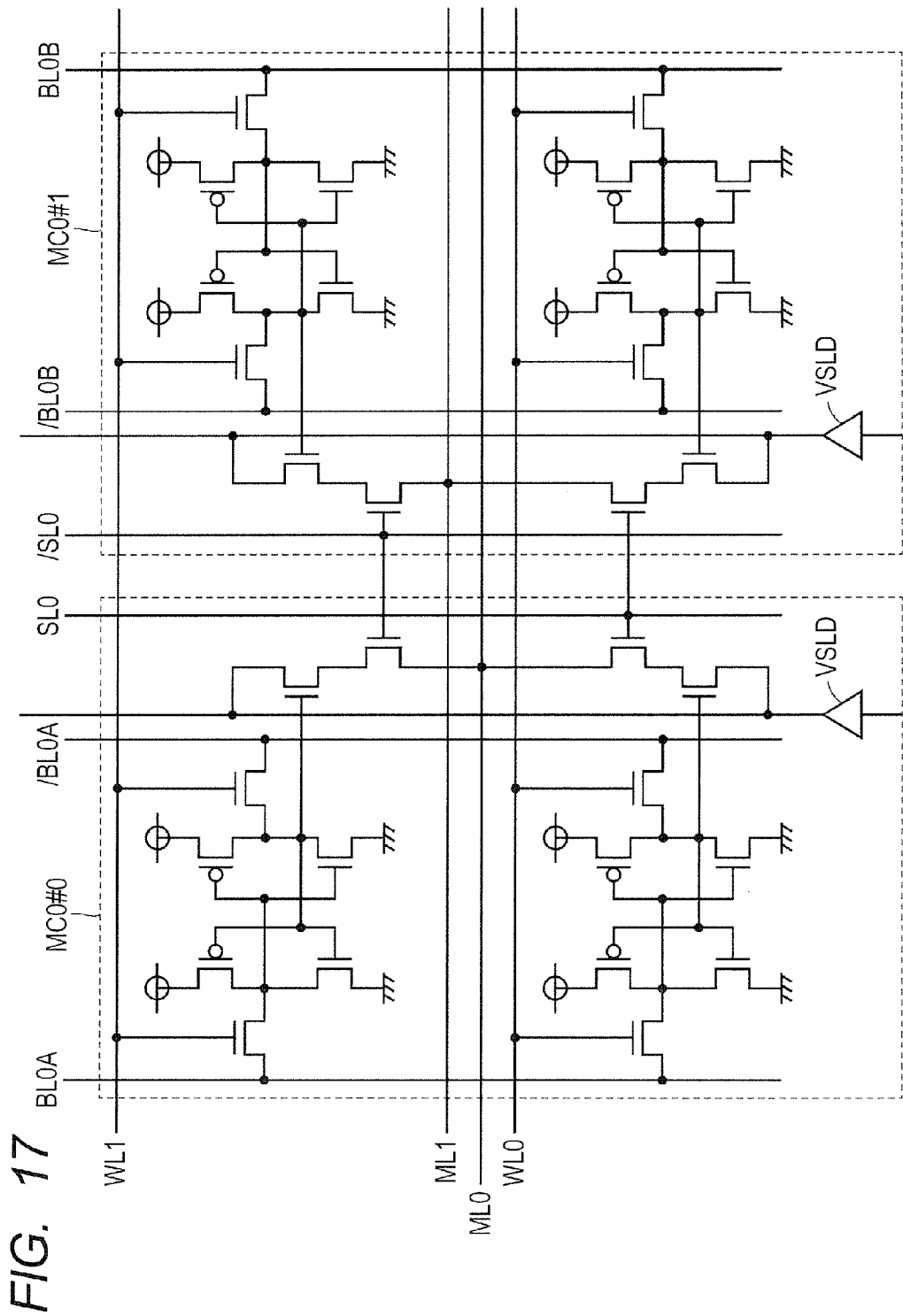
FIG. 17 is a diagram for explaining the layout of a portion of a memory array according to a fourth embodiment.

FIG. 17 is a diagram for explaining the layout of a portion of a memory array according to the fourth embodiment.

In the example shown in FIG. 17, a power supply line driver VSLD is provided for each column to control the power supply line VSL for the column.

Figure 18A:
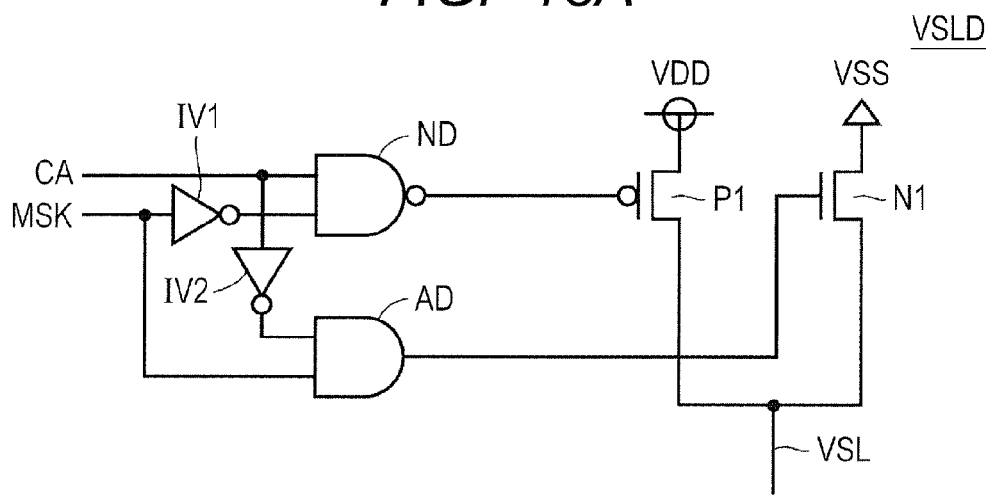
FIGS. 18A and 18B are diagrams for explaining the configuration of a power supply line driver VSLD according to the fourth embodiment.
Figure 18B:
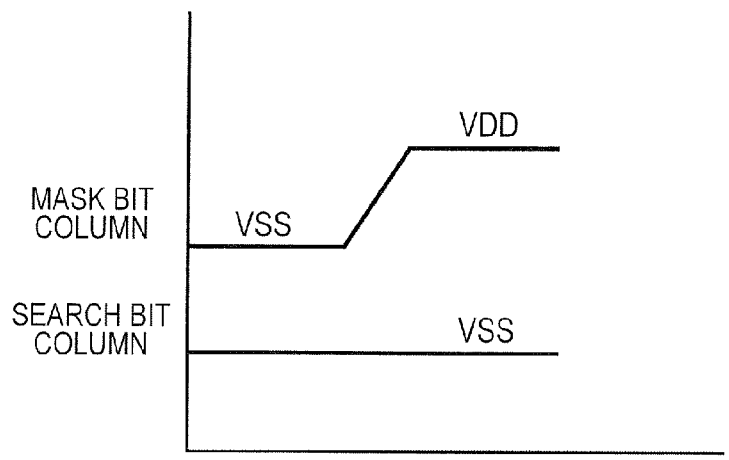

FIGS. 18A and 18B are diagrams for explaining the configuration of a power supply line driver VSLD according to the fourth embodiment.

Referring to FIG. 18A, the power supply line driver VSLD includes a NAND circuit ND, an AD circuit AD, inverters IV, an N-channel MOS transistor N1, and a P-channel MOS transistor P1.

The NAND circuit ND receives a column selection signal CA and an inverted signal generated by inverting a mask signal MSK at an inverter IV1, and outputs the result of a NAND logical operation performed between the two input signals to the P-channel MOS transistor P1.

The AND circuit AD receives an inverted signal generated by inverting a column selection signal CA at an inverter IV2 and a MASK signal MSK, and outputs the result of an AND logical operation performed between the two input signals to the N-channel MOS transistor N1.

When the column selection signal CA is at "H" level and the mask signal MSK is at "L" level, the P-channel MOS transistor P1 is conductive. In this state, the power supply voltage VDD and the power supply line VSL are electrically coupled.

When the column selection signal CA is at "L" level and the mask signal MSK is at "H" level, the N-channel MOS transistor N1 is conductive. In this state, the ground voltage VSS and the power supply line VSL are electrically coupled.

FIG. 18B illustrates comparison between a mask bit column and a search bit column. The mask bit column is set to the potential of the power supply line VDD. The search bit column is set to the potential of the ground line VSS.

A mask bit column maintains the potential of the match line ML0 by being set to the potential of the power supply line VDD. Without the potential of the mask bit column being lowered to the potential of the ground line VSS, the mask bit column is not subjected to matching/non-matching determination.

The above configuration allows a mask bit column to be set easily by controlling the potential of the power supply line VSL.

The invention made by the present inventors has been concretely described based on embodiments. The invention, however, is not limited to the above embodiments and can be modified in various ways without departing from the scope of the invention.

What is claimed is:

1. A semiconductor memory device comprising a plurality of memory cells arranged like a matrix, each of the memory cells being configured to be capable of holding two bits of information and including a first cell configured to be capable of holding one bit of information, a second cell adjacent, in a column direction, to the first cell and configured to be capable of holding another bit of information, and a logic operation cell coupled to the first cell and the second cell, the semiconductor memory device further comprising:
a bit line pair extending in the column direction and coupled to both the first and the second cell;
a first and a second word line extending in a row direction and coupled to the first and the second cell, respectively;
a match line extending in the row direction and coupled to the logic operation cell;
a search line pair extending in the column direction and coupled to the logic operation cell;
the logic operation cell driving the match line based on comparison results between information held in the first and the second cell and search data transferred by the search line pair;
and a search line driver provided correspondingly to the search line pair to drive the search line pair,
wherein, in a state with the search line pair precharged to a third voltage between a first voltage and a second voltage, the search line driver drives, according to the search data, one and the other search line included in the search line pair to the first and the second voltage, respectively.

2. The semiconductor memory device according to claim 1,
wherein the logic operation cell is coupled between the match line and a power supply line and includes a first and a second logic unit to drive, during the data search, the match line based on respective comparison results between information held in the first and the second cell and the search data, and
wherein the power supply line is, before a data search, set to the third voltage and is, at a time of the data search, set to the second voltage.

3. The semiconductor memory device according to claim 2,
wherein the first logic unit includes a first and a second transistor coupled in series between the power supply line and the match line,
wherein the second logic unit includes a third and a fourth transistor coupled in series between the power supply line and the match line,
wherein gates of the first and the third transistor receive information held in the first and the second cell, respectively, and
wherein gates of the second and the fourth transistor receive the search data.

4. The semiconductor memory device according to claim 3,
wherein sources of the first and the third transistor are coupled to the power supply line.

5. The semiconductor memory device according to claim 3,
wherein sources of the second and the fourth transistor are coupled to the power supply line.

6. The semiconductor memory device according to claim 1, further comprising an equalizer circuit provided correspondingly to the search line pair to equalize the search line pair before a data search.

7. A semiconductor memory device comprising a plurality of memory cells arranged like a matrix, each of the memory cells being configured to be capable of holding two bits of information and including a first cell configured to be capable of holding one bit of information, a second cell adjacent, in a column direction, to the first cell and configured to be capable of holding another bit of information, and a logic operation cell coupled to the first cell and the second cell, the semiconductor memory device further comprising:
a bit line pair extending in the column direction and coupled to both the first and the second cell;
a first and a second word line extending in a row direction and coupled to the first and the second cell, respectively;
a match line extending in the row direction and coupled to the logic operation cell;
the logic operation cell driving the match line based on comparison results between information held in the first and the second cell and search data;
a search line pair to transfer the search data for a data search, the search line pair extending in the column direction and being commonly coupled to logic operation cells included in a first and a second of the memory cells adjacent to each other in the row direction; and
a search line driver provided correspondingly to the search line pair to drive the search line pair,
wherein, in a state with the search line pair precharged to a third voltage between a first voltage and a second voltage, the search line driver drives, according to the search data, one and the other search line included in the search line pair to the first and the second voltage, respectively.

8. The semiconductor memory device according to claim 7,
wherein the logic operation cell of the first memory cell is coupled to a first match line extending in the row direction across the first and the second memory cell adjacent to each other, and
wherein the logic operation cell of the second memory cells is coupled to a second match line extending in the row direction across the first and the second memory cells adjacent to each other.

9. A semiconductor memory device comprising a plurality of memory cells arranged like a matrix, each of the memory cells being configured to be capable of holding two bits of information and including a first cell configured to be capable of holding one bit of information, a second cell adjacent, in a column direction, to the first cell and configured to be capable of holding another bit of information, and a logic operation cell coupled to the first cell and the second cell, the semiconductor memory device further comprising:
a bit line pair extending in the column direction and coupled to both the first and the second cell;
a first and a second word line extending in a row direction and coupled to the first and the second cell, respectively;
a match line extending in the row direction and coupled to the logic operation cell, the match line being arranged for common use by memory cells mutually adjacent in the row direction;
a search line extending in the column direction and coupled to the logic operation cell;

the logic operation cell driving the match line precharged to a first voltage to a second voltage based on comparison results between information held in the first and the second cell and search data transferred by the search line;

a search line driver provided correspondingly to the search line to drive the search line using the first voltage in accordance with the search data; and a detection circuit that is coupled to the match line and outputs a data search result based on a potential difference between the match line and the first voltage.

10. The semiconductor memory device according to claim 9, wherein, when information held in the first and the second cell and search data transferred by the search line matches, the potential of the match line is caused to rise above the search line voltage precharged by applying the first voltage, and wherein, when information held in the first and the second cell and search data transferred by the search line does not match, the match line is driven to the second voltage by the logic operation cell.

11. The semiconductor memory device according to claim 10, wherein the logic operation cell is coupled between the match line and a power supply line and includes a first and a second logic unit that drive, at a time of the data search, the match line based on respective comparison results between information held in the first and the second cell and the search data, and wherein the power supply line is set to the second voltage for a data search and is set to the first voltage for data masking.

* * * * *